(12) United States Patent
Blomquist et al.

(10) Patent No.: US 11,465,402 B2
(45) Date of Patent: Oct. 11, 2022

(54) PRINTING FORM PRECURSOR, A PROCESS FOR MAKING THE PRECURSOR, AND A METHOD FOR PREPARING A PRINTING FORM FROM THE PRECURSOR

(71) Applicant: DUPONT ELECTRONICS, INC., Wilmington, DE (US)

(72) Inventors: Robert M Blomquist, River Edge, NJ (US); Bradley K Taylor, West Chester, PA (US); John Stephen Locke, Hockessin, DE (US); Mark A Hackler, Ocean, NJ (US)

(73) Assignee: DUPONT ELECTRONICS, INC., Wilmington, DE (US)

( * ) Notice: Subject to any disclaimer, the term of this patent is extended or adjusted under 35 U.S.C. 154(b) by 0 days.

(21) Appl. No.: 16/858,474

(22) Filed: Apr. 24, 2020

(65) Prior Publication Data

US 2020/0254749 A1    Aug. 13, 2020

Related U.S. Application Data

(62) Division of application No. 15/165,469, filed on May 26, 2016, now Pat. No. 10,668,711.
(Continued)

(51) Int. Cl.
*B41C 1/00* (2006.01)
*G03F 7/20* (2006.01)

(52) U.S. Cl.
CPC .............. *B41C 1/006* (2013.01); *G03F 7/202* (2013.01)

(58) Field of Classification Search
CPC .................................................... G03F 7/202
See application file for complete search history.

(56) References Cited

U.S. PATENT DOCUMENTS

| 2,760,863 | A | 8/1956 | Plambeck, Jr. |
| 3,036,913 | A | 5/1962 | Burg |

(Continued)

FOREIGN PATENT DOCUMENTS

| EP | 0741329 A2 | 11/1996 |
| EP | 0504824 B1 | 1/1998 |

(Continued)

OTHER PUBLICATIONS

PCT International Search Report for Application No. PCT/US2016/034563; Mingam, Claudie, Authorized Officer; ISA/EP; dated Dec. 13, 2016.

*Primary Examiner* — Chanceity N Robinson
(74) *Attorney, Agent, or Firm* — Simon L. Xu

(57) ABSTRACT

A photosensitive element, particularly a photopolymerizable printing form precursor; a method of preparing the photosensitive element to form a printing form for use in relief printing; and a process of making the photosensitive element are disclosed. The printing form precursor includes a layer of a photosensitive composition, a digital layer that is adjacent to a side of the photosensitive layer, and a cell pattern layer that is disposed between the photosensitive layer and the digital layer. The cell pattern layer includes a plurality of features, and is composed of an ink that is opaque to actinic radiation and transparent to infrared radiation. Since the cell pattern layer is integral with the printing form precursor, digital imaging can occur rapidly with relatively low resolution optics to form a mask without needing to also form a microcell pattern of the digital layer.

3 Claims, 6 Drawing Sheets

Related U.S. Application Data

(60) Provisional application No. 62/169,901, filed on Jun. 2, 2015.

(56) References Cited

U.S. PATENT DOCUMENTS

| | | |
|---|---|---|
| 3,796,602 A | 3/1974 | Briney et al. |
| 4,323,637 A | 4/1982 | Chen et al. |
| 4,427,759 A | 1/1984 | Gruetzmacher et al. |
| 4,460,675 A | 7/1984 | Gruetzmacher et al. |
| 5,215,859 A | 6/1993 | Martens |
| 5,262,275 A | 11/1993 | Fan |
| 5,279,697 A | 1/1994 | Peterson et al. |
| 5,506,086 A | 4/1996 | Van Zoeren |
| 5,607,814 A | 3/1997 | Fan et al. |
| 5,654,125 A | 8/1997 | Fan et al. |
| 5,705,310 A | 1/1998 | Van Zoeren |
| 5,719,009 A | 2/1998 | Fan |
| 5,760,880 A | 6/1998 | Fan et al. |
| 5,766,819 A | 6/1998 | Blanchet-Fincher |
| 5,798,019 A | 8/1998 | Cushner et al. |
| 5,840,463 A | 11/1998 | Blanchet-Fincher |
| 6,037,102 A | 3/2000 | Loerzer et al. |
| 6,238,837 B1 | 5/2001 | Fan |
| 6,284,431 B1 | 9/2001 | Tanizaki et al. |
| 6,492,095 B2 | 12/2002 | Samworth |
| 6,558,876 B1 | 5/2003 | Fan |
| 6,673,509 B1 | 1/2004 | Metzger |
| 6,797,454 B1 | 9/2004 | Johnson et al. |
| 6,929,898 B2 | 8/2005 | Fan |
| RE39,835 E * | 9/2007 | Kanga ............... G03F 7/029 430/271.1 |
| 2010/0007692 A1 | 1/2010 | Vanmaele et al. |
| 2010/0014384 A1 | 1/2010 | Colombo et al. |
| 2010/0112484 A1 | 5/2010 | Kato et al. |
| 2013/0017493 A1 | 1/2013 | Cook et al. |
| 2013/0216955 A1* | 8/2013 | Schieffer, Jr. ......... G03F 7/36 430/306 |
| 2014/0057208 A1 | 2/2014 | Schieffer et al. |

FOREIGN PATENT DOCUMENTS

| | | |
|---|---|---|
| EP | 0741330 B1 | 11/1999 |
| EP | 0891877 B1 | 1/2003 |
| EP | 2460657 B1 | 1/2014 |
| GB | 2241352 A | 8/1991 |
| WO | 98/13730 A1 | 4/1998 |

* cited by examiner

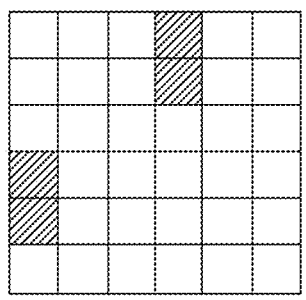
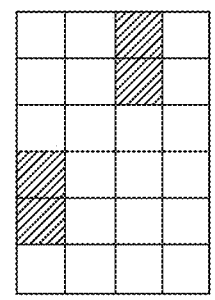
FIG. 3A          FIG. 3B
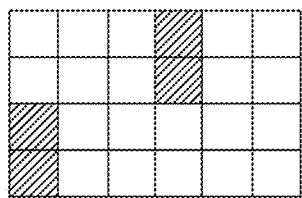
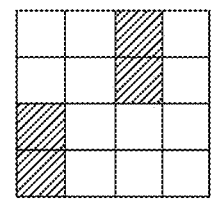
FIG. 3C          FIG. 3D
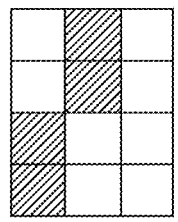
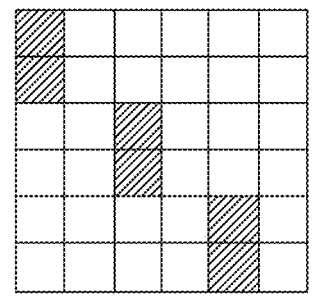
FIG. 3E          FIG. 3F

PRINTING FORM PRECURSOR, A PROCESS FOR MAKING THE PRECURSOR, AND A METHOD FOR PREPARING A PRINTING FORM FROM THE PRECURSOR

This application claims priority under 35 U.S.C. § 119 from U.S. Provisional Application Ser. No. 62/169,901, filed Jun. 2, 2015.

BACKGROUND OF THE INVENTION

1. Field of the Disclosure

This invention pertains to a photosensitive element and a method for preparing a printing form from the photosensitive element, and in particular, to a photosensitive element that is a printing form precursor useful for forming a printing form suitable for relief printing.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. Photosensitive elements generally have a solid layer of the photopolymerizable composition interposed between a support and a coversheet or a multilayer cover element. Photopolymerizable elements are characterized by their ability to crosslink or cure upon exposure to actinic radiation.

Photopolymerizable elements undergo a multi-step process to be converted to a flexographic relief printing form. The photopolymerizable element is imagewise exposed with actinic radiation through an image-bearing art-work, such as a photographic negative, transparency, or phototool (e.g., silver halide films) for so called analog workflow, or through an in-situ mask having radiation opaque areas that had been previously formed above the photopolymerizable layer for so called digital workflow. The actinic radiation exposure is typically conducted with ultraviolet (UV) radiation. The actinic radiation enters the photosensitive element through the clear areas and is blocked from entering the black or opaque areas of the transparency or in-situ mask. The areas of the photopolymerizable layer that were exposed to the actinic radiation crosslink and harden; and, the areas of the photopolymerizable layer that were unexposed, i.e., areas that were under the opaque regions of the transparency or the in-situ mask during exposure, are not cross-linked or hardened, and are removed by treating with a washout solution or with heat leaving a relief image suitable for printing. After all desired processing steps, the printing form is then mounted on a cylinder and used for printing.

Analog workflows involve making an intermediate, i.e., the photographic negative, transparency, or phototool. Preparation of a phototool, such as from a silver halide film, is a complicated, costly and time-consuming process that can require separate processing equipment and chemical development solutions. Alternatively, a phototool can also be prepared from thermal imaging films, or by inkjet methods. Also, quality issues can arise with the use of phototool since the phototool may change slightly in dimension due to changes in temperature and humidity, and all surfaces of the phototool and the photopolymer plate should be clean and free of dust and dirt. The presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor and processes capable of forming an in-situ mask in digital workflow are described in U.S. Pat. Nos. 5,262,275; 5,719,009; 5,607,814; 6,238,837; 6,558,876; 6,929,898; 6,673,509; 6,037,102; and 6,284,431. The precursor or an assemblage with the precursor includes a layer sensitive to laser radiation, typically infrared laser radiation, and opaque to actinic radiation. The infrared-sensitive layer is imagewise exposed with laser radiation of a digital imager unit whereby the infrared-sensitive material is removed from, or transferred onto/from a superposed film of the assemblage, to form the in-situ mask having radiation opaque areas and clear areas adjacent the photopolymerizable layer. Conventionally, the precursor is exposed through the in-situ mask to actinic radiation in the presence of atmospheric oxygen (since no vacuum is needed). Due in part to the presence of atmospheric oxygen during imagewise exposure, the flexographic printing form has a relief structure that is different from the relief structure formed in analog workflow (based upon the same size mask openings in both workflows). Digital workflow creates a raised element (i.e., dot or line) in the relief structure having a surface area of its uppermost surface (i.e., printing surface) that is significantly less than the opening in the in-situ mask corresponding to the relief structure, depending on the specific precursor chemistry and actinic radiation irradiance. Digital workflow results in the relief image having a different structure for raised elements that print small dots (i.e., raised surface elements) that is typically smaller, with a rounded top, and a curved sidewall profile, often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form. But not all end-use applications view this dot-sharpening effect as beneficial.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. As disclosed in U.S. Pat. No. 8,241,835, conventional digital workflow has been modified in which imagewise exposure of a precursor occurs in an environment having an inert gas and a concentration of oxygen less than atmospheric oxygen but greater than a completely inert gas environment, i.e., the concentration of oxygen is between 190,000 parts per million (ppm) and 100 ppm. The modified digital workflow provides ease of use of digital workflow while avoiding the dot-sharpening effect of the relief features associated with conventional digital workflow to create relief features having an analog-like appearance.

Additionally, it is often desirable for the flexographic relief printing form to print images, particularly solid areas, with uniform, dense coverage of ink, so-called solid ink density. Poor transfer or laydown of ink from the printing form to the substrate, especially in large areas, results in print defects, such as mottle and graininess. Unsatisfactory printing results are especially obtained with solvent-based printing inks, and with UV-curable printing inks.

There are a number of ways to try and improve the ink density in solid areas of an image printed by a flexographic relief printing form. One way to improve solid ink density is to increase the physical impression between the printing form and the substrate. While this will increase solid ink density, the increased pressure will tend to deform smaller plate elements resulting in increased dot gain and loss of resolution. Another method of improving solid ink density involves increasing the surface area of the relief printing form, since a relief printing form with a roughened surface may hold and thus transfer to the substrate more ink than a smooth surface, and may result in a more uniform appearance. However, the surface roughness should be sufficient to increase ink transfer but not so much as to cause discreet features to directly print as this would result in undesirable artifacts in the final print. Typically a printing form that includes a matted layer and is prepared by analog workflow successfully retains the roughened surface, but in some instances there can be some loss of the fine structure of the roughened surface when prepared by conventional digital workflow because of the dot sharpening effect.

Solid screening is a well-known process for improving the solid ink density in flexographic printing. Solid screening consists of creating a pattern in the solid printing areas of the relief printing form which is small enough that the pattern is not reproduced in the printing process (i.e., printed image), and large enough that the pattern is substantially different from the normal, i.e., unscreened, printing surface. A pattern of small features that is used for solid screening is often referred to as a plate cell pattern or a microcell pattern.

GB 2 241 352 A discloses a process for preparing photopolymer plates having a plurality of well-like depressions by exposing the photopolymer layer to actinic radiation through a photographic mask containing optically transparent areas and optically opaque image areas, and a screen having a plurality of opaque discrete dots or other geometric shapes onto a photopolymer plate and developing the plate, to form a plurality of depressions in the relief planar surface of the exposed portions of the photopolymer layer.

Samworth in U.S. Pat. No. 6,492,095 discloses a flexographic printing plate having solid image areas which are covered by a plurality of very small and shallow cells. The cells are created via a screened film halftone negative, an intermediate photomask, or via a top layer on the plate that is used as a mask.

Currently, various microcell patterns are widely used to improve the capability of relief printing forms to print solids with uniform, dense coverage of ink, i.e., solid ink density. The microcell patterns may be used in solid areas to improve printed ink density, as well as for text, line work, halftones, that is, any type of image element where an improvement in ink transfer characteristics is realized. In digital workflow, a microcell pattern is made into a digital file which is used by the digital imager unit to incorporate the pattern of microcells with the formation of the in-situ mask using laser radiation, usually infrared laser radiation. That is, the microcell pattern is formed from the infrared-sensitive layer that forms the in-situ mask. The microcell pattern is effectively superimposed in the digital file on image areas (often solids) where improved solid ink density is desired. Examples of patterns are small "negative" (blocking actinic radiation) features, e.g. a 96% halftone dot at 400 lines per inch, representing an array of approximately 14 micron diameter actinic radiation-blocking dots approximately 64 microns apart; and small "positive" (passing actinic radiation) features much closer together, e.g. a 12% halftone dot at 1400 lines per inch, representing an array of approximately 7 micron diameter actinic radiation-passing dots approximately 18 microns apart. In the latter example of small "positive" features, the effect of oxygen (dot sharpening) associated with conventional digital workflow can impact the ability to hold the microcell patterns in solid printing areas of the relief printing form. Typically, the finer the pattern of microcells, i.e. the smaller the size of each cell and closer the spacing of the cells, that is formed, the better the results. One problem with this method is that the additional cells increase the amount of time for laser imaging by the laser imager unit of the photosensitive element. In order to provide finer microcell patterns, companies that manufacture digital imager units have had to improve the optical resolution of their imagers and improve their imaging software as well. Both aspects substantially increase the cost of the imager and the time needed to image the photosensitive element.

Stolt et al. in US Patent Publication 2010/0143841 disclose a method to increase solid ink density printing capability for a relief printing form through digital patterning of image areas of the precursor. Stolt et al. disclose applying a pattern to all image feature areas in halftone data that is used to produce an image mask, which is then used to convert the precursor into a relief printing form. After processing, the printing form carries a relief image that resolves the pattern in the surface of the relief features, and provides solid relief features to maintain or increase printed solid ink densities. A problem with this method is that it is still essentially an analog workflow since a phototool is created that is then contacted by lamination with the photopolymerizable layer of the precursor.

So a need arises for a relief printing form to meet the increasing demands for print quality to improve the transfer of ink to printed substrate and to print, particularly solid areas, with uniform, dense coverage of ink. It is also desirable for the printing form to have a relief structure capable of printing a full tonal range including printing of fine print elements and highlight dots and thereby providing improved print quality. There is a need for a method that is simple and relatively quick in preparing the relief printing form from a photosensitive printing form precursor, and yet can provide the printing form with a relief structure that improves transfer of ink to the substrate, without detrimental impact to dot gain and/or image resolution. It is desirable that the method utilizes a digital-like workflow for its ease and simplicity that results in the printing form having a relief structure with features necessary for high quality printing, without the additional expense to upgrade or purchase new digital imaging equipment and software and without the loss in productivity for high resolution imaging in order to form microcell patterns.

SUMMARY

An embodiment provides a printing form precursor comprising:

a photopolymerizable layer comprising a first binder, a monomer, and a photoinitiator;

an infrared ablation layer that is ablatable by infrared radiation and opaque to non-infrared actinic radiation, the infrared ablation layer comprising:
(i) at least one infrared absorbing material;
(ii) a radiation opaque material, wherein (i) and (ii) can be the same or different; and
(iii) at least one second binder; and a pattern layer that is disposed between the photopolymerizable layer and the infrared ablation layer, and comprises a plurality of features in which each feature has an area between 5 to 750 square microns and is composed of an ink that is opaque to actinic radiation and transparent to infrared radiation.

Another embodiment provides that the pattern layer is printed on a surface of the photopolymerizable layer opposite a support.

Another embodiment provides that the infrared ablation layer is applied by coating to the photopolymerizable layer over the printed pattern layer.

Another embodiment provides that the pattern layer is printed onto a surface of the infrared ablation layer that will be adjacent to and substantially contacting a surface of the photopolymerizable layer.

Another embodiment provides that the ink is a cyan ink.

Another embodiment provides that the ink contains a UV absorbing material.

Another embodiment provides a printing form precursor comprising:

a photopolymerizable layer comprising a first binder, a monomer, and a photoinitiator;

an infrared ablation layer that is ablatable by infrared radiation and opaque to non-infrared actinic radiation, the infrared ablation layer comprising:
(i) at least one infrared absorbing material;
(ii) a radiation opaque material, wherein (i) and (ii) can be the same or different; and
(iii) at least one second binder;

a coversheet; and a pattern layer that is disposed between the infrared ablation layer and the coversheet, and comprises a plurality of features in which each feature has an area between 5 to 750 square microns and is composed of an ink that is opaque to actinic radiation and transparent to infrared radiation.

Another embodiment provides that the pattern layer is printed onto a surface of the coversheet, and the infrared ablation layer is formed by coating over the printed pattern layer to form an assembly.

Another embodiment provides that the assembly is ablated by exposure to infrared radiation, and is applied by lamination to a surface of the photopolymerizable layer that is opposite a support.

Another embodiment provides that the infrared ablation layer has a transmission optical density of greater than 2.0.

Another embodiment provides a method of making a printing form precursor comprising:

a) applying a photopolymerizable composition comprising a first binder, a monomer, and a photoinitiator onto a support to form a photopolymerizable layer;

b) printing an ink onto a surface of the photopolymerizable layer opposite the support to form a pattern layer;

c) applying an infrared ablation composition forming an infrared ablation layer on the photopolymerizable layer over the printed pattern layer, the infrared ablation composition comprising (i) at least one infrared absorbing material; (ii) a radiation opaque material, wherein (i) and (ii) can be the same or different; and (iii) at least one second binder.

Another embodiment provides that the pattern layer comprises a plurality of features wherein each feature has an area between 5 to 750 square microns, and the ink is opaque to actinic radiation and transparent to infrared radiation.

Another embodiment provides a method of making a printing form precursor comprising:

a) applying an infrared sensitive composition forming an infrared ablation layer on a temporary support, b) printing a plurality of features with an ink onto a surface of the infrared ablation layer that is opposite the temporary support to form a pattern layer on the surface, wherein the pattern layer comprises a plurality of features wherein each feature has an area between 5 to 750 square microns, and the ink is opaque to actinic radiation and transparent to infrared radiation, thereby forming a digital coversheet;

c) applying a photopolymerizable composition comprising a first binder, a monomer, and a photoinitiator, forming a photopolymerizable layer between a support and the digital coversheet, wherein the pattern layer is disposed between the photopolymerizable layer and the infrared ablation layer.

Another embodiment provides that the infrared sensitive composition comprising (i) at least one infrared absorbing material; (ii) a radiation opaque material, wherein (i) and (ii) can be the same or different; and (iii) at least one second binder.

Another embodiment provides a method of making a printing form precursor comprising:

a) printing a plurality of features with an ink onto a surface of a coversheet to form a pattern layer on the surface, wherein the pattern layer comprises a plurality of features wherein each feature has an area between 5 to 750 square microns, and the ink is opaque to actinic radiation and transparent to infrared radiation;

a) applying an infrared sensitive composition to the pattern layer to form an infrared ablation layer;

b) exposing to infrared radiation to cause ablation to the infrared ablation layer;

c) laminating onto a surface of a photopolymerizable layer comprising a first binder, a monomer, and a photoinitiator, that is opposite a support for the photopolymerizable layer, wherein the pattern layer is disposed between the infrared ablation layer and the coversheet.

Another embodiment provides that the infrared sensitive composition comprising (i) at least one infrared absorbing material; (ii) a radiation opaque material, wherein (i) and (ii) can be the same or different; and (iii) at least one second binder.

Another embodiment provides a method of preparing a relief printing form from a printing form precursor comprising:

a) imagewise removing an infrared ablation layer with infrared laser radiation to form a mask on the precursor, wherein the precursor comprises a photopolymerizable layer comprising a first binder, a monomer, and a photoinitiator; an infrared ablation layer that is ablatable by infrared radiation and opaque to non-infrared actinic radiation, the infrared ablation layer comprising (i) at least one infrared absorbing material; (ii) a radiation opaque material, wherein (i) and (ii) can be the same or different; and (iii) at least one second binder; and, a pattern layer disposed between the photopolymerizable layer and the infrared laser radiation ablation layer, wherein the pattern layer comprises a plurality of features in which each feature has an area between 5 to 750 square microns and is composed of an ink that is opaque to actinic radiation and transparent to infrared radiation, and further wherein the mask comprises actinic radiation opaque areas and open areas, and the features of the pattern layer remain in the open areas;

b) overall exposing the precursor to actinic radiation through the mask forming exposed portions and unexposed portions in the photopolymerizable layer; and c) treating the precursor of step b) to remove the infrared ablation layer which was not removed during step a) and the unexposed portions of the photopolymerizable layer, thereby forming a relief surface for printing.

Yet another embodiment provides that the overall exposing step b) is in an environment having an inert gas and a concentration of oxygen between 190,000 ppm and 100 ppm.

These and other features and advantages of the present invention will be more readily understood by those of ordinary skill in the art from a reading of the following Detailed Description. Certain features of the invention which are, for clarity, described above and below as a separate embodiment, may also be provided in combination in a single embodiment. Conversely, various features of the invention that are described in the context of a single embodiment, may also be provided separately or in any subcombination.

BRIEF DESCRIPTION OF THE DRAWINGS

The invention can be more fully understood from the following detailed description thereof in connection with the accompanying drawing described as follows:

FIG. 3a through FIG. 3j are each one embodiment of a cell pattern unit, that can be used in the generation of a printing form that can print with an ink a microcell pattern, for incorporation in a relief printing form precursor of the present invention that includes a preformed microcell pattern. The cell pattern unit is repeatable and stored as a file, and in one embodiment as exemplified in Example 1, in another embodiment as exemplified in Example 2, and in yet another embodiment as exemplified in Example 3, is used by a digital imager unit that directs infrared laser radiation to selectively ablate an infrared sensitive layer of a relief printing form precursor to create an in-situ mask on the precursor. The cell pattern unit includes black blocks which represent areas of the infrared sensitive layer that will be removed or ablated by infrared laser radiation; and, clear or white blocks which represent areas of the infrared sensitive layer that will remain on the printing form precursor. A cell pattern unit has a percent mask transparency value that is obtained by dividing the total number of black blocks by the total number of blocks in the pattern. After suitable exposure and treatment steps to convert the precursor to a relief printing form, the relief printing form has a relief surface that is capable of printing with an ink a pattern useful as a microcell pattern for use in a relief printing form precursor.

FIG. 3a is one embodiment of a cell pattern unit that is repeated and used to create Digital Coversheet for Test 1 of Examples 1 and 2, wherein the cell pattern consists of a 6×6 block of cells in which 4 blocks of 36 blocks are black, and has a mask transparency of 11.1%.

FIG. 3b is one embodiment of a cell pattern unit that is repeated and used to create Digital Coversheet for Test 2 of Examples 1 and 2, wherein the cell pattern consists of a 4×6 block of cells in which 4 blocks of 24 blocks are black, and has a mask transparency of 16.7%.

FIG. 3c is one embodiment of a cell pattern unit that is repeated and used to create Digital Coversheet for Test 3 of Examples 1 and 2, wherein the cell pattern consists of a 6×4 block of cells in which 4 blocks of 24 blocks are black, and has a mask transparency of 16.7%.

FIG. 3d is one embodiment of a cell pattern unit that is repeated and used to create Digital Coversheet for Test 4 of Examples 1 and 2, wherein the cell pattern consists of a 4×4 block of cells in which 4 blocks of 16 blocks are black, and has a mask transparency of 25%.

FIG. 3e is one embodiment of a cell pattern unit that is repeated and used to create Digital Coversheet for Test 5 of Example 1, wherein the cell pattern consists of a 3×4 block of cells in which 4 blocks of 12 blocks are black, and has a mask transparency of 33%.

FIG. 3f is one embodiment of a cell pattern unit that is repeated and used to create Digital Coversheet for Test 5 of Example 2, wherein the cell pattern consists of a 6×6 block of cells in which 6 blocks of 36 blocks are black, and has a mask transparency of 16.7%.

FIG. 3g is one embodiment of an intended cell pattern unit that was expected to have been formed on a Digital Coversheet for Test 6 of Example 2 by first printing of the repeating cell pattern unit of FIG. 3b onto the laser ablatable layer, and then printing of the repeating cell pattern unit of FIG. 3c onto the previously printed cell pattern layer.

FIG. 3h is one embodiment of a cell pattern unit that is repeated and used to create Digital Coversheet for Test 1 of Example 3, wherein the cell pattern consists of a 4×4 block of cells in which 2 blocks of 16 blocks are black, and has a mask transparency of 12.5%.

FIG. 3i is one embodiment of a cell pattern unit that is repeated and used to create Digital Coversheet for Test 2 of Example 3, wherein the cell pattern consists of a 15×15 block of cells in which 60 blocks of 225 blocks are black, and has a mask transparency of 26.7%.

FIG. 3j is one embodiment of a cell pattern unit that is repeated and used by sequentially printing the same repeating cell pattern unit a first time and a second time with the cell pattern rotated 90 degrees to create Digital Coversheet for Test 3 of Example 3, wherein the cell pattern consists of a 4×1 block of cells in which 1 block of 4 blocks are black, and has a mask transparency of 25%.

FIG. 4a is a microscopic image taken of Digital Coversheet of Test 1 having an overall cell pattern printed in ink on the infrared ablatable layer, wherein the Test 1 cell pattern was formed by repeating the cell pattern unit as shown in FIG. 3a.

FIG. 4b is a microscopic image taken of Digital Coversheet of Test 2 having an overall cell pattern printed in ink on the infrared ablatable layer, wherein the Test 2 cell pattern was formed by repeating the cell pattern unit as shown in FIG. 3b.

FIG. 4c is a microscopic image taken of Digital Coversheet of Test 3 having an overall cell pattern printed in ink on the infrared ablatable layer, wherein the Test 3 cell pattern was formed by repeating the cell pattern unit as shown in FIG. 3c.

FIG. 4d is a microscopic image taken of Digital Coversheet of Test 4 having an overall cell pattern printed in ink on the infrared ablatable layer, wherein the Test 4 cell pattern was formed by repeating the cell pattern unit as shown in FIG. 3d.

FIG. 4e is a microscopic image taken of Digital Coversheet of Test 5 having an overall cell pattern printed in ink on the infrared ablatable layer, wherein the Test 5 cell pattern was formed by repeating the cell pattern unit as shown in FIG. 3e.

FIG. 5a is a microscope image of a raised printing surface of the Relief Printing Plate of Test 1 that printed solids with increased ink density, showing a pattern of microcells in the print surface that was formed by the printed cell pattern that was integrated into the Printing Plate Precursor via the Digital Coversheet as shown in FIG. 4a.

FIG. 5b is a microscope image of a raised printing surface of the Relief Printing Plate of Test 2 that printed solids with increased ink density, showing a pattern of microcells in the print surface that was formed by the printed cell pattern that was integrated into the Printing Plate Precursor via the Digital Coversheet as shown in FIG. 4b.

FIG. 5c is a microscope image of a raised printing surface of the Relief Printing Plate of Test 3 that printed solids with increased ink density, showing a pattern of microcells in the print surface that was formed by the printed cell pattern that was integrated into the Printing Plate Precursor via the Digital Coversheet as shown in FIG. 4c.

FIG. 5d is a microscope image of a raised printing surface of the Relief Printing Plate of Test 4 that prints solids, showing the structures in the print surface that was formed by the printed cell pattern that was integrated into the Printing Plate Precursor via the Digital Coversheet as shown in FIG. 4d.

FIG. 5e is a microscope image of a raised printing surface of the Relief Printing Plate of Test 5 that prints solids, showing the structures in the print surface that was formed by the printed cell pattern that was integrated into the Printing Plate Precursor via the Digital Coversheet as shown in FIG. 4e.

DESCRIPTION OF THE PREFERRED EMBODIMENTS

Figure 1:
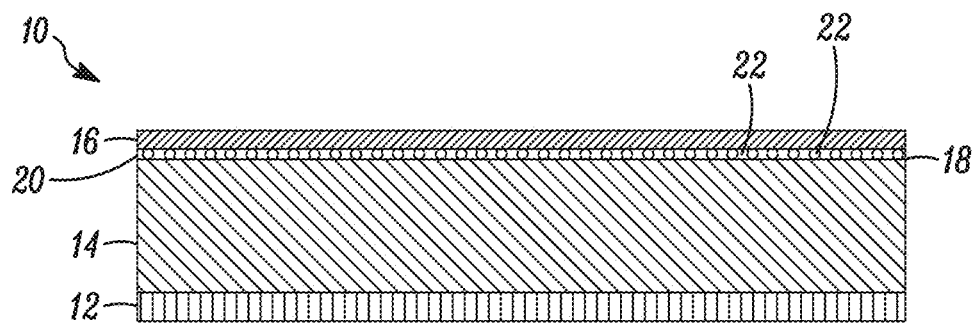
FIG. 1 is a schematic representation of one embodiment of a cross-section of a photosensitive element that is a printing form precursor, where the photosensitive element includes a photopolymerizable layer on a support; a digitally imageable layer that is infrared-sensitive and radiation-opaque and is disposed above the photopolymerizable layer; and, a layer of a pre-printed microcell pattern disposed between the digitally imageable layer and the photopolymerizable layer.

Throughout the following detailed description, similar reference characters refer to similar elements in all figures of the drawings.

Unless otherwise indicated, the following terms as used herein have the meaning as defined below.

"Actinic radiation" refers to radiation capable of initiating reaction or reactions to change the physical or chemical characteristics of a photosensitive composition.

"Lines per inch" (LPI) is a measurement of printing resolution in systems which use a halftone screen. It is a measure of how close together lines in a halftone grid are. Higher LPI generally indicates greater detail and sharpness to an image.

"Halftone" is used for the reproduction of continuous-tone images, by a screening process that converts the image into dots of various sizes and equal spacing between centers. A halftone screen enables the creation of shaded (or grey) areas in images that are printed by transferring (or non-transferring) of a printing medium, such as ink.

"Continuous tone" refers to an image that has a virtually unlimited range of color or shades of grays, that contains unbroken gradient tones having not been screened.

"Dots per inch" (DPI) is a frequency of dot structures in a tonal image, and is a measure of spatial printing dot density, and in particular the number of individual dots that can be placed within the span of one linear inch (2.54 cm). The DPI value tends to correlate with image resolution. Typical DPI range for graphics applications: 75 to 150, but can be as high as 300.

"Line screen resolution", which may sometimes be referred to as "screen ruling" is the number of lines or dots per inch on a halftone screen.

"Optical Density" or simply "Density" is the degree of darkness (light absorption or opacity) of an image, and can be determined from the following relationship:

$$\text{Density} = \log_{10}\{1/\text{reflectance}\}$$

where reflectance is {intensity of reflected light/intensity of incident light}. Density is commonly calculated in conformance with ISO 5/3:2009 International Standard for Photography and graphic technology—Density measurements—Part 3: Spectral conditions.

"Solid Ink Density" is a measure of the density of a printed area meant to display the maximum amount of print color.

"Graininess" refers to the variation in density of print areas. The ISO-13660 International Print Quality Standard defines it as, "Aperiodic fluctuations of density at a spatial frequency greater than 0.4 cycles per millimeter in all directions." The ISO-13660 metric of graininess is the standard deviation of density of a number of small areas that are 42 um square.

"Cell pattern unit" refers to the smallest repeat structure of a microcell pattern. Cell pattern units, some embodiments of which are shown in FIGS. 3a through 3j, are bitmap files that are tiled or repeated to provide desired coverage and used by a digital imager unit to form a mask of a digital layer of a printing precursor that will be used to print a pattern of microcells, i.e., "Printed Microcell Pattern", as a layer of a photosensitive element of the present invention. Each cell pattern unit includes black blocks which represent areas of the digital layer of the printing precursor that will be removed or ablated by infrared laser radiation; and, clear or white blocks which represent areas of the digital layer that will remain on the precursor. Each block is representative of a pixel at 4000 pixels per inch which results in a size of 6.35 microns on a side.

"Printed microcell pattern" refers to a composite of features that together form a pattern that is printed for inclusion at some stage of production of the photosensitive element of the present invention. A printed microcell pattern in which a plurality of features is printed with a particular ink for incorporation into a photosensitive element is distinguished from a microcell pattern that is conventionally formed in a digital layer of a photosensitive element with infrared laser radiation by a digital imager device.

"Cell pattern layer" refers to the printed microcell pattern that forms a layer integral to the photosensitive element of the present invention, and is oriented between a source of actinic radiation and a surface of the photosensitive layer that will ultimately become the printing surface of the resulting relief printing form.

"Microcells" refer to image elements or microcells that alter a print surface, which can appear as dimples and/or very tiny reverses, and that are each smaller in at least one dimension than the spacing between smallest periodic structures on the printing form that results from the photosensitive element of the present invention. The microcells are irregularities on a print surface of the relief printing form that are designed to improve the uniformity and apparent density of ink printed on a substrate by the relief printing form. In some embodiments, microcells of the relief printing form can correspond with features of the printed microcell pattern that is integrated into the present photosensitive element.

"Microcell pattern" refers to a composite of image elements or microcells that together form a pattern that alters a print surface of a relief printing form which results from the photosensitive element of the present invention.

The term "pattern" is not limited in reference to "cell pattern unit", "microcell pattern", "printed microcell pattern", and "cell pattern layer"; and, refers to placement of the individual features relative to one another, to include as a composite of the individual feature patterns that are random, pseudo-random, or regular, in one or two directions.

"Visible radiation or light" refers to a range of electromagnetic radiation that can be detected by the human eye, in which the range of wavelengths of radiation is between about 390 and about 770 nm.

"Infrared radiation or light" refers to wavelengths of radiation between about 770 and $10^6$ nm.

"Ultraviolet radiation or light" refers to wavelengths of radiation between about 10 and 390 nm.

Note that the provided ranges of wavelengths for infrared, visible, and ultraviolet are general guides and that there may be some overlap of radiation wavelengths between what is generally considered ultraviolet radiation and visible radiation, and between what is generally considered visible radiation and infrared radiation.

"White light" refers to light that contains all the wavelengths of visible light at approximately equal intensities, as in sunlight.

"Room light" refers to light that provides general illumination for a room. Room light may or may not contain all the wavelengths of visible light.

The term "photosensitive" encompasses any system in which the photosensitive composition is capable of initiating a reaction or reactions, particularly photochemical reactions, upon response to actinic radiation. Upon exposure to actinic radiation, chain propagated polymerization of a monomer and/or oligomer is induced by either a condensation mechanism or by free radical addition polymerization. While all photopolymerizable mechanisms are contemplated, the compositions and processes of this invention will be described in the context of free-radical initiated addition polymerization of monomers and/or oligomers having one or more terminal ethylenically unsaturated groups. In this context, the photoinitiator system when exposed to actinic radiation can act as a source of free radicals needed to initiate polymerization of the monomer and/or oligomer. The monomer may have non-terminal ethylenically unsaturated groups, and/or the composition may contain one or more other components, such as a binder or oligomer, that promote crosslinking. As such, the term "photopolymerizable" is intended to encompass systems that are photopolymerizable, photocrosslinkable, or both. As used herein, photopolymerization may also be referred to as curing. The photosensitive element may also be referred to herein as a photosensitive precursor, photosensitive printing precursor, printing precursor, and precursor.

As used herein, the term "solid" refers to the physical state of the photosensitive layer that has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

The term "digital layer" encompasses a layer that is responsive or alterable by laser radiation, particularly infrared laser radiation, and more particularly is ablatable by infrared laser radiation. The digital layer is also opaque to non-infrared actinic radiation. The digital layer may also be referred to herein as an infrared-sensitive layer, an infrared-sensitive ablation layer, a laser ablatable layer, or an actinic radiation opaque layer.

Unless otherwise indicated, the terms "photosensitive element", "printing form precursor", "printing precursor", and "printing form" encompass elements or structures in any form suitable as precursors for printing, including, but not limited to, flat sheets, plates, seamless continuous forms, cylindrical forms, plates-on-sleeves, and plates-on-carriers.

The present invention concerns a photosensitive element, particularly a photopolymerizable printing form precursor; a method of preparing the photosensitive element to form a printing form; and, a process of making the photosensitive element. The photosensitive element includes a layer of a composition sensitive to actinic radiation which in most embodiments is a composition that is photopolymerizable. The photosensitive element includes a layer of the photosensitive composition, a digital layer adjacent to the photosensitive layer, and a cell pattern layer. The cell pattern layer includes a plurality of features in which each feature has an area between 5 to 750 square microns and is composed of an ink that is opaque to actinic radiation and transparent to infrared radiation. In most embodiments, the digital layer is ablatable by infrared radiation and opaque to non-infrared actinic radiation. The cell pattern layer is a microcell pattern that is preprinted, i.e., a printed microcell pattern, with the ink and integrated into the photosensitive element at time of manufacture.

Advantages of the present photosensitive element having a printed cell pattern layer integral to the photosensitive element include that it saves the end-user time and can increase productivity in the preparation of a printing form from the photosensitive element. The presence of the cell pattern layer avoids the need for end-users to form a microcell pattern in the digital layer with a digital imager device, and can increase productivity in the preparation of the printing form since the mask can be formed in the digital layer by a low resolution digital imager device that is operated at high speed. And since the cell pattern layer is pre-printed at manufacture, cell patterns can be created and printed using high resolution systems, such as gravure printing and high resolution flexographic printing, and thus end-users can avoid the need for a costly high resolution digital imager device with substantially increased imaging time to create the plate cell pattern and the mask from the digital layer. Furthermore, the relief printing form that results from the present photosensitive precursor advantageously meets the increasing demands for print quality to improve the transfer of ink to printed substrate and to print, particularly solid areas, with uniform, dense coverage of ink, and capable of printing a full tonal range including printing of fine print elements and highlight dots.

Photosensitive Element

The photosensitive element includes a layer of the photosensitive composition, a digital layer adjacent to the photosensitive layer, and a cell pattern layer. The cell pattern layer is integrated in the photosensitive element, or is integrated in a separate element that is combined with a photopolymerizable layer to form the photosensitive element. In one embodiment, the photosensitive element includes a layer of the photosensitive composition, a digital layer that is adjacent to the photosensitive layer, and a cell pattern layer that is disposed between the photosensitive layer and the digital layer. In another embodiment, the photosensitive element includes a support, a layer of the photosensitive composition adjacent to the support, a digital layer that is adjacent to a side of the photosensitive layer that is opposite the support, and a cell pattern layer that is disposed between the photosensitive layer and the digital layer. In yet another embodiment, the photosensitive element includes a layer of the photosensitive composition adjacent to an optional support, a digital layer that is adjacent to a side of the photosensitive layer that is opposite the optional support, and a cell pattern layer that is disposed on or above a side of the digital layer that is opposite the photosensitive layer. Optionally, the photosensitive element can include a support on a side of the photosensitive layer that is opposite the digital layer, and/or a coversheet on a side of the digital layer that is opposite the photosensitive layer.

FIG. 1 depicts one embodiment of a photosensitive element 10 of the present invention that is a printing form precursor 10 used for preparing printing forms. The printing form precursor 10 includes a support 12, at least one layer of a photosensitive composition 14 that is on or adjacent the optional support 12, a digital layer 16 adjacent to a side 18 of the photosensitive layer 14 that is opposite the support 12, and one embodiment cell pattern layer 20 that is disposed between the photosensitive layer 14 and the digital layer 16. In most embodiments the photosensitive layer 14 is a layer of a photopolymerizable composition. The precursor 10 shown in FIG. 1 is exploded with the digital layer 16 separated from photopolymerizable layer 14 so that a plurality of features 22 of the cell pattern layer 20 can be seen disposed between the digital layer 16 and the photopolymerizable layer 14, and integrated as a layer within the printing form precursor 10. In most embodiments, the plurality of features 22 of the cell pattern layer 20 that is printed with an ink is so thin relative to its adjacent layers, i.e., the digital layer 16 and the photopolymerizable layer 14, that the cell pattern layer would not actually be seen in cross-section, and in this embodiment the digital layer would appear to directly contact the photopolymerizable layer.

Optionally the photosensitive element 10 can include one or more additional layers and/or a coversheet, but for simplicity the additional layers and coversheet is not shown in the embodiment of the precursor 10 of FIG. 1. A coversheet that is removable can be disposed on or above a side of the digital layer 16 that is opposite the photopolymerizable layer 14. The photosensitive element 10 can optionally include a barrier layer and/or a wax layer between the digital layer and the cell pattern layer, and a side of the barrier layer that is opposite the digital layer would substantially contact the photopolymerizable layer. The photosensitive element 10 can optionally include an elastomeric capping layer between the photopolymerizable layer and the cell pattern layer, such that the cell pattern layer is between the elastomeric capping layer and the digital layer. Other additional layers are also possible.

In most embodiments, the printing forms are a relief printing forms that encompass flexographic printing forms and letterpress printing forms. The photosensitive element precursor for printing end-use and the printing form can be of any shape or form including plates and cylinders. The embodiment of the photosensitive printing precursor 10 shown in FIG. 1 is a plate form. Relief printing is a method of printing in which the printing form prints from an image area, where the image area of the printing form is raised and the non-image area is recessed. Relief printing includes flexographic printing and letterpress printing.

In order to render the cell pattern layer 20 useful for its intended purpose which is to create a pattern of very small image elements, so-called microcells, on a print surface of a relief printing form, the cell pattern layer that is a printed microcell pattern is oriented between a source of actinic radiation and a surface of the photosensitive layer that will ultimately become the printing surface of the resulting relief printing form. In most embodiments of the photosensitive element, the cell pattern layer is a printed microcell pattern that is disposed between the digital layer and the photopolymerizable layer. In some other embodiments of the photosensitive element, the cell pattern layer is a printed microcell pattern that is disposed on a side of the digital layer that is opposite the photopolymerizable layer, i.e., the digital layer is between the photopolymerizable layer and the cell pattern layer. In yet other embodiments of the photosensitive element, the cell pattern layer is a printed microcell pattern is disposed in or on a separate cover element, such as a barrier layer coversheet, The cell pattern layer 20 includes a plurality of features each having an area of 5 to 750 square microns and separated from adjacent features with spacing on average of 5 to 30 micron as determined by a geometric centroid of each feature. Each feature of the pattern is a two-dimensional shape (based on a planar view) that is not limited, and can have a convex perimeter, or a non-convex perimeter. Non-limiting examples of features with two-dimensional shapes having a convex perimeter include circles, squares, and rectangles. Non-limiting examples of features with two-dimensional shapes having a non-convex perimeter include kidney shapes, and crescent shapes. Each feature can be separate or disconnected from other adjacent features. Alternatively, each feature can overlap with other adjacent features to thereby form larger "super-features" that refers to a union of two-dimensional areas covered by overlapping portions, and as such features may appear larger in shape or have a connected shape. The plurality of features are printed as a pattern to create a layer-like effect (but not a continuous layer of ink) that is integrated and superimposed on the entire or substantially entire surface area of the photosensitive element, thereby forming the cell pattern layer.

The plurality of features can be applied directly or indirectly to a layer of the photosensitive element to form the cell pattern layer by printing with the ink that in most embodiments is opaque to actinic radiation and transparent to infrared radiation. The ink that is used to print the features of the cell pattern layer is transparent to, i.e., does not absorb, infrared radiation, particularly at the wavelength/s of infrared laser radiation that is used to form the mask of the digital layer, so that the features of the cell pattern layer are not removed by, or disturbed, or modified by, the impinging laser radiation. The ink that is used to print the features of the cell pattern layer is opaque to, i.e., does absorb, actinic radiation, particularly at the wavelength/s of actinic radiation (such as ultraviolet radiation at 350 to 380 nm), that is used to expose and cure the photosensitive layer, so that the features can sufficiently block the radiation and provide for the formation of corresponding microcells on the print surface of the resulting printing form.

It should be understood that "opaque to actinic radiation" with particular reference to the property of the ink that prints the features encompasses "opaque or substantially opaque to actinic radiation", that is, the feature that is printed with the ink can, but need not, absorb 100% of the incident actinic radiation, and can absorb less than 100% of the incident actinic radiation with the proviso that a microcell can be created in the print surface of the resulting relief printing form. The absorbance of the ink after printing to actinic radiation, particularly to ultraviolet radiation, can be determined by transmission density measurement. One example of a device suitable for measuring transmission density, and used for the present invention, is an X-Rite 361T tabletop transmission densitometer, in UV mode, (X-Rite, Inc., Grand Rapids, Mich., U.S.A.)

It should also be understood that "transparent to infrared radiation" with particular reference to the property of the ink that prints the features encompasses "transparent or substantially transparent to infrared radiation", that is, the feature that is printed with the ink can, but need not, transmit 100% of the incident infrared (laser) radiation, and can transmit less than 100% of the incident infrared (laser) radiation with the proviso that a feature is not removed or modified, or not substantially removed or modified, by the infrared laser radiation that is used to create the mask from the digital layer. One method to determine if the ink is suitably transparent to infrared laser radiation is to print the ink as a patch onto a transparent film substrate, such as a polyester film; mount the printed film in a digital imager; and expose the printed film to infrared laser radiation from the imager. If the printed patch after digital exposure is not changed or altered, or not substantially changed or altered, the ink is acceptably transparent to infrared radiation.

In other embodiments of the photosensitive element, the plurality of features can be applied directly or indirectly to a layer of the photosensitive element to form the cell pattern layer by printing with an ink that is opaque to actinic radiation, and is not necessarily transparent to infrared radiation.

Since absorbance, and transparency, of an ink is directly proportional to the thickness of the ink laid down and the concentration of the absorbing materials in the ink, the determination of the ability of the ink to prevent or substantially prevent transmission of actinic radiation and to transmit or substantially transmit infrared radiation is most appropriately determined after ink is applied or printed onto the surface of the printing precursor by the desired method. In one embodiment, the plurality of features of the cell pattern layer is generated with an ink that is suitable for printing and blocks 80 to 100% of the actinic radiation and transmits 80 to 100% of the infrared radiation, i.e., incident infrared laser radiation, particularly after printing the features. In another embodiment, the plurality of features of the cell pattern layer is generated with a printing ink and blocks 80 to 99% of the actinic radiation and transmits 80 to 99% of the infrared radiation, i.e., incident infrared laser radiation, particularly after printing features.

Ink is a fluid or paste used for printing that is composed of a pigment or dye in a liquid vehicle. Inks are formulated to meet various requirements that include color, opacity, fade resistance, pliability, odorlessness, drying, and health and environmental safety. In some embodiments inks can include one or more components that absorb actinic radiation, particularly ultraviolet radiation. Inks can be formulated by those skilled in the art to eliminate or to reduce the absorbance of infrared radiation. Inks suitable for use in the present invention are not limited. It is within the skill of a person in the art to formulate an ink to accommodate the particular printing method, e.g., relief printing, gravure printing, ink-jet printing, letterpress printing, lithographic printing, screen printing with ink jet, thermal transfer printing, and electrophotographic printing, which is used to print the features of the cell pattern layer and to provide the features of the printed microcell pattern to be sufficiently opaque actinic radiation and transparent infrared radiation on a surface of the printing precursor. Although the printing method that is used to print the cell pattern layer should facilitate production purposes, e.g., suitable to print the cell pattern layer on a moving web, the cell pattern layer could also be printed by other methods that are not conventionally printed onto a web, such as, intaglio printing, and stencil printing, as well. The ink laid down or applied or printed on layer of the photosensitive element has a thickness which is dependent upon the particular printing method, the printing conditions, the ink, and the particular surface on which the cell pattern layer is printed. The thickness of the ink printed for the plurality of features is not limited. Acceptable results can occur over a wide range of ink thicknesses.

To the extent that the ink is opaque to actinic radiation and transparent to infrared radiation, the color of the ink is not limited. However, the selection of color for the ink may be influenced by the inherent absorbance of the ink relative to the actinic radiation, and transparency of the ink to infrared radiation. In most embodiments, the ink is cyan colored since the absorbance of cyan inks into the ultraviolet region is typically sufficient to block actinic radiation and transparent to infrared radiation. If the ink is not sufficiently absorptive of actinic radiation, particularly ultraviolet radiation, ultraviolet absorbing compound/s could be added to the ink. One exception is that while the addition of certain compound/s, such as carbon black, to an ink would increase its absorbance of ultraviolet radiation, the compound would also increase its absorbance of infrared radiation, particularly near-infrared radiation, which would be problematic for digital imaging with infrared laser radiation.

The digital layer 16 is employed in digital direct-to-plate image technology in which laser radiation, typically infrared laser radiation, is used to form a mask of the image for the photosensitive element (instead of the conventional image transparency or phototool). The digital layer is opaque or substantially opaque to actinic radiation that corresponds with the sensitivity of the photopolymerizable material; and is sensitive to infrared laser radiation. The digital layer can be a single layer that provides both functions of opaque to actinic radiation and sensitive to infrared radiation. Alternatively, the digital layer can be a composite of two or more separate layers in which the each functionality of opaque to actinic radiation and sensitive to infrared radiation is provided in one of the separate layers. In one embodiment, digital methods use the laser radiation to create from the digital layer a mask image that can be formed in situ on or disposed above the photopolymerizable layer of the printing form precursor. In other embodiments, digital methods use the laser radiation to create from the digital layer a mask that is formed on a digital element that is separate from the photopolymerizable layer, and subsequently the digital element with the mask is applied to the photopolymerizable layer forming the printing form precursor.

In some embodiments, the photosensitive element initially includes the digital layer disposed above and covers or substantially covers the entire surface of the photopolymerizable layer; and the cell pattern layer is disposed between the digital layer and the photopolymerizable layer. In some embodiments, the infrared laser radiation imagewise removes, i.e., ablates or vaporizes, the digital layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the digital layer may be present during laser exposure to capture the material of the digital layer as it is removed from the photosensitive element as disclosed by Van Zoeren in U.S. Pat. No. 5,705,310. Only the portions of the digital layer that were not removed from the photosensitive element will remain on the element forming the in-situ mask.

In another embodiment, the photosensitive element will not initially include the digital layer. A separate element bearing the digital layer will form an assemblage with the photosensitive element (that in this embodiment includes primarily the photopolymerizable layer and the optional support) such that the digital layer is adjacent the surface of the photosensitive element opposite the support, which is typically is the photopolymerizable layer. If present, a coversheet associated with the photosensitive element typically is removed prior to forming the assemblage. In one embodiment, the cell pattern layer is printed onto the surface of the photopolymerizable layer that is opposite the support. The separate element includes at least the digital layer on a polymeric film, and may include one or more other layers, such as ejection layers or heating layers, to aid in the digital exposure process. Hereto, the digital layer is also sensitive to infrared radiation. In one embodiment, the assemblage is exposed imagewise with infrared laser radiation to selectively transfer or selectively alter the adhesion balance of the digital layer and form the mask on or disposed above the photopolymerizable layer, so that the cell pattern layer is not covered by the non-transferred portions of the digital layer (and the cell pattern layer is between the photopolymerizable layer and the transferred portions of the digital layer). Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the digital layer will reside on the photosensitive element forming the in-situ mask, and the cell pattern layer will be present in the open portions of the mask.

In some other embodiments, the cell pattern layer and the digital layer form a separate element. The digital layer of the separate element is imagewise exposed to infrared laser radiation to form the mask, which then forms an assemblage with the photosensitive element (that in this embodiment includes primarily the photopolymerizable layer and the optional support) such that the mask of the digital layer is adjacent the surface of the photosensitive element opposite the support, which is typically is the photopolymerizable layer. (If present, the coversheet associated with the photosensitive element typically is removed prior to forming the assemblage.) In this embodiment of the separate element, the cell pattern layer is disposed between a film and the digital layer. And after the separate element with a mask of the digital layer forms the assemblage with the photopolymerizable layer, the photosensitive element includes film (of separate element), the cell pattern layer, the digital layer forming a mask, the photopolymerizable layer, and optional support. The film of the separate element may remain with the assemblage, and be present during imagewise exposure of the photosensitive layer.

Materials constituting the digital layer and structures incorporating the digital layer are not particularly limited, provided that the digital layer can be imagewise exposed to form the in-situ mask on or adjacent the photopolymerizable layer of the photosensitive element. The digital layer may substantially cover the surface or only cover an imageable portion of the photopolymerizable layer. The digital layer can be used with or without a barrier layer. If used with the barrier layer, the barrier layer is disposed between the photopolymerizable layer and the digital layer to minimize migration of materials between the photopolymerizable layer and the digital layer. Monomers and plasticizers can migrate over time if they are compatible with the materials in an adjacent layer, which can alter the laser radiation sensitivity of the digital layer or can cause smearing and tackifying of the digital layer after imaging. The digital layer is also sensitive to laser radiation that can selectively remove or transfer digital layer.

In some embodiments, the digital layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the digital layer should be in a range to optimize both sensitivity and opacity, which is generally from about 20 Angstroms to about 50 micrometers. The digital layer should have a transmission optical density of greater than 2.0 in order to effectively block actinic radiation and the polymerization of the underlying photopolymerizable layer.

The digital layer includes (i) at least one infrared absorbing material, (ii) a radiation opaque material, wherein (i) and (ii) can be the same or different, and at least one binder. The following materials are suitable as the binder for the digital layer and include, but not limited to, polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomer, copolymers of vinyl chloride and vinyl acetate, copolymers of styrene and butadiene, copolymers of styrene and isoprene, thermoplastic block copolymers of styrene and butadiene, thermoplastic block copolymers of styrene and isoprene, polyisobutylene, polybutadiene, polycholorprene, butyl rubber, nitrile rubber, thermoplastic polyurethane elastomer, cyclic rubbers, copolymers of vinylacetate and (meth)acrylate, acrylonitrile-butadiene-styrene terpolymer, methacrylate-butadiene-styrene terpolymer, alkyl methacrylate polymer or copolymer, copolymers of styrene and maleic anhydride, copolymers of styrene and maleic anhydride partially esterified with alcohols, and combinations thereof. Preferred binders include polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, cyclic rubber, copolymer of styrene and maleic anhydride, copolymer of styrene and maleic anhydride partially esterified with alcohol, polyester elastomers, and combinations thereof.

Materials suitable for use as the radiation opaque material and the infrared absorbing material include, but is not limited to, metals, metal alloys, pigments, carbon black, graphite and combinations thereof. Mixtures of pigments in which each pigment functions as the infrared absorbing material, or the radiation opaque material (or both) can be used with the binder. Dyes are also suitable as infrared absorbing agents. Examples of suitable dyes include poly (substituted)phthalocyanine compounds; cyanine dyes; squarylium dyes; chalcogenopyrloarylidene dyes; bis(chalcogenopyrylo)-polymethine dyes; oxyindolizine dyes; bis(aminoaryl)-polymethine dyes; merocyanine dyes; croconium dyes; metal thiolate dyes; and quinoid dyes. Preferred is carbon black, graphite, metal, and metal alloys that functions as both the infrared absorbing material and the radiation opaque material. The radiation opaque material and the infrared absorbing material may be in dispersion to facilitate handling and uniform distribution of the material.

The photopolymerizable layer 14 is a solid layer formed of the composition comprising a binder, at least one ethylenically unsaturated compound, and a photoinitiator. The photoinitiator is sensitive to actinic radiation. Throughout this specification actinic radiation will include ultraviolet radiation and/or visible light. The solid layer of the photopolymerizable composition is treated with one or more solutions and/or heat to form a relief suitable for relief printing. As used herein, the term "solid" refers to the physical state of the layer which has a definite volume and shape and resists forces that tend to alter its volume or shape.

A solid layer of the photopolymerizable composition may be polymerized (photohardened), or unpolymerized, or both. In some embodiments, the layer of the photopolymerizable composition is elastomeric. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer).

The binder can be a single polymer or mixture of polymers. In some embodiments, the binder is an elastomeric binder. In other embodiments, the layer of the photopolymerizable composition is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the elastomeric block copolymer of an A-B-A type block copolymer, where A represents a non-elastomeric block, preferably a vinyl polymer and most preferably polystyrene, and B represents an elastomeric block, preferably polybutadiene or polyisoprene. In some embodiments, the elastomeric A-B-A block copolymer binders can be poly(styrene/isoprene/styrene) block copolymers, poly(styrene/butadiene/styrene) block copolymers, and combinations thereof. The binder is present in an amount of about 10% to 90% by weight of the photosensitive composition. In some embodiments, the binder is present at about 40% to 85% by weight of the photosensitive composition.

Other suitable binders include acrylics; polyvinyl alcohol; polyvinyl cinnamate; polyamides; epoxies; polyimides; styrenic block copolymers; nitrile rubbers; nitrile elastomers; non-crosslinked polybutadiene; non-crosslinked polyisoprene; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition. The at least one compound capable of addition polymerization (i.e., monomer) is present in at least an amount of 5%, typically 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. In most embodiments, the photoinitiator for the main exposure (as well as post-exposure and backflash) is sensitive to visible or ultraviolet radiation, between 310 to 400 nm, and preferably 345 to 365 nm. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing plate desired, for example, from about 0.005 inches to about 0.250 inches or greater (about 0.013 cm to about 0.64 cm or greater). In some embodiments, the photopolymerizable layer has a thickness from about 0.005 inch to 0.0450 inch (0.013 cm to 0.114 cm). In some other embodiments, the photopolymerization layer has a thickness from about 0.020 inches to about 0.112 inches (about 0.05 cm to about 0.28 cm). In other embodiments, the photopolymerizable layer has a thickness from about 0.112 inches to about 0.250 inches or greater (0.28 cm to about 0.64 cm or greater). As is conventional in the art, manufacturers typically identify the printing precursors relative to the total thickness of the printing form on press, which includes the thickness of the support and the photopolymerizable layer. The thickness of the photopolymerizable layer for the printing form is typically less than the manufacturer's designated thickness since the thickness of the support is not included.

The photosensitive element can include one or more additional layers on or adjacent the photosensitive layer. In most embodiments the one or more additional layers are on a side of the photosensitive layer opposite the support. Examples of additional layers include, but are not limited to, a protective layer, a capping layer, an elastomeric layer, a barrier layer, and combinations thereof. The one or more additional layers can be removable, in whole or in part, during one of the steps to convert the element into a printing form, such as treating.

Optionally, the photosensitive element may include an elastomeric capping layer on the at least one photopolymerizable layer. The elastomeric capping layer is typically part of a multilayer cover element that becomes part of the photosensitive printing element during calendering of the photopolymerizable layer. Multilayer cover elements and compositions suitable as the elastomeric capping layer are disclosed in Gruetzmacher et al., U.S. Pat. Nos. 4,427,759 and 4,460,675. In some embodiments, the composition of the elastomeric capping layer includes an elastomeric binder, and optionally a monomer and photoinitiator and other additives, all of which can be the same or different than those used in the bulk photopolymerizable layer. Although the elastomeric capping layer may not necessarily contain photoreactive components, the layer ultimately becomes photosensitive when in contact with the underlying bulk photopolymerizable layer. As such, upon imagewise exposure to actinic radiation, the elastomeric capping layer has cured portions in which polymerization or crosslinking have occurred and uncured portions which remain unpolymerized, i.e., uncrosslinked. Treating causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate. In embodiments of the photosensitive element that include the elastomeric capping layer, the cell pattern layer is disposed between the elastomeric capping layer and the digital layer.

For some embodiments of photosensitive elements useful as relief printing forms, the surface of the photopolymerizable layer may be tacky and a release layer having a substantially non-tacky surface can be applied to the surface of the photopolymerizable layer. Such release layer can protect the surface of the photopolymerizable layer from being damaged during removal of an optional temporary coversheet or other digital mask element and can ensure that the photopolymerizable layer does not stick to the coversheet or other digital mask element. During image exposure, the release layer can prevent the digital element with the mask from binding with the photopolymerizable layer. The release layer is insensitive to actinic radiation. The release layer is also suitable as a first embodiment of the barrier layer which is optionally interposed between the photopolymerizable layer and the digital layer. The elastomeric capping layer may also function as a second embodiment of the barrier layer. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof.

The photosensitive printing element may also include a temporary coversheet on top of an uppermost layer of the element, which may be removed prior to preparation of the printing form. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film.

The optional support 12 can be any flexible material that is conventionally used with photosensitive elements 10 used to prepare printing forms. In most embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions metals, such as aluminum, may also be used as a support, even though a metal support is not transparent to radiation. Supports of a film composed of a synthetic resin and an antihalation agent as disclosed by Swatton et al. in EP 0 504 824 B1 are also suitable for use in the present invention. The support can be planar for use in a printing form that is plate-shaped, and can be cylindrical for use in a printing form that is a cylinder, often referred to as a printing sleeve. In one embodiment, the support is a polyester film; and, particularly a polyethylene terephthalate film. In some embodiments, the support itself can include an ultraviolet absorbent material in the film composition and/or the material can be included in a layer on the support.

The support may be in sheet form or in cylindrical form, such as a sleeve. The sleeve may be formed from single layer or multiple layers of flexible material. Flexible sleeves made of polymeric films or composite materials are preferred, as they typically are sufficiently transparent to ultraviolet radiation to accommodate backflash exposure for building a floor in the cylindrical printing element. A preferred sleeve is a multiple layered sleeve as disclosed in EP 2460657 A1. The sleeve may also be made of non-transparent, actinic radiation blocking materials, such as nickel or glass epoxy. The support has a thickness that can be from 0.002 to 0.250 inch (0.0051 to 0.635 cm). The support typically has a thickness from 0.002 to 0.050 inch (0.0051 to 0.127 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more. In other embodiments, the sleeve has a wall thickness of 10 to 40 mils (0.025 to 0.10 cm).

Optionally, the element includes an adhesive layer between the support 12 and the photopolymerizable layer 14, or a surface of the support that is adjacent the photopolymerizable layer has an adhesion promoting surface. The adhesive layer on the surface of the support can be a subbing layer of an adhesive material or primer or an anchor layer as disclosed in U.S. Pat. Nos. 2,760,863 and 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated.

Process to Make Photosensitive Element

The process of making the photosensitive element includes a step in which the cell pattern layer is created by printing a microcell pattern with an ink onto a layer of the photosensitive element; or, onto a layer of a separate element or film that forms an assemblage with the photopolymerizable layer to form the photosensitive element. The cell pattern layer is a microcell pattern that is preprinted, i.e., printed microcell pattern, and integrated into the photosensitive element at time of manufacture. In most embodiments, the cell pattern layer is created and incorporated as an integral layer between the digital layer and the photopolymerizable layer of the photosensitive element. In some embodiments, the cell pattern layer is printed onto a surface of the digital layer that will be adjacent to and substantially contacting a surface of the photopolymerizable layer that is opposite the support. In some other embodiments, the cell pattern layer is printed onto a surface of a film support and a digital layer is formed by coating over the cell pattern layer, which the composite of the film support, cell pattern layer, the digital layer form a digital coversheet that is combined with the photopolymerizable layer before or after selective removal by ablation of the digital layer. In yet other embodiments, the cell pattern layer is printed onto a surface of the photopolymerizable layer that is opposite the support, and will be adjacent to the digital layer. In one embodiment, the ink that prints the features of the microcell pattern is opaque to actinic radiation and is transparent to infrared radiation. In other embodiments, the ink that prints the features of the microcell pattern is opaque to actinic radiation and need not be transparent to infrared radiation. The printing of the cell pattern layer can be done online during manufacture of the digital layer, or online during manufacture of the photosensitive element, or offline separate from either manufacture process. The printing of the cell pattern layer can be done in one pass; or, in multiple passes, using one or more print forms to print the particular features. In some embodiments, the cell pattern layer is printed onto a surface, e.g., digital layer, of an element of the precursor that is in web form. In this embodiment, the cell pattern layer is printed onto the surface of a moving web with a printing form that is cylindrical, such as a CYREL® Round photopolymer form, so that the microcell pattern is continuously printed without seams or disruption to the printed microcell pattern.

It is well within the skill of the practitioner in the art to make or manufacture a photosensitive element printing form precursor that includes a layer of the photopolymerizable composition formed by admixing the binder, monomer, photoinitiator, and other optional additives. Since in most embodiments, the cell pattern layer is applied by printing onto a surface of the digital layer that will be adjacent the photopolymerizable layer, the cell pattern layer should withstand and not be disturbed or destroyed by the elevated temperature/s that is typically used to manufacture the photopolymerizable printing form precursor. In most embodiments, the photopolymerizable mixture is formed into a hot melt, extruded, calendered at temperatures above room temperature to the desired thickness between two sheets, such as the support and the temporary coversheet having the digital layer, or between one flat sheet and a release roll. Alternately, the photopolymerizable material can be extruded and/or calendered to form a layer onto a temporary support and later laminated to the desired final support or to a digital coversheet. The printing form precursor can also be prepared by compounding the components in a suitable mixing device and then pressing the material into the desired shape in a suitable mold. The material is generally pressed between the support and the coversheet. The molding step can involve pressure and/or heat.

The photosensitive element includes at least one photopolymerizable layer that can be of a bi- or multi-layer construction. Further, the photosensitive element may include an elastomeric capping layer on the at least one photopolymerizable layer. Multilayer cover elements and compositions suitable as the elastomeric capping layer are disclosed in Gruetzmacher et al., U.S. Pat. Nos. 4,427,759 and 4,460,675.

Cylindrically shaped photopolymerizable elements may be prepared by any suitable method. In one embodiment, the cylindrically shaped elements can be formed from a photopolymerizable printing plate that is wrapped on a carrier or cylindrical support, i.e., sleeve, and the ends of the plate mated to form the cylinder shape. The cylindrically shaped photopolymerizable element can also be prepared extrusion and calendering in-the-round according to the method and apparatus disclosed by Cushner et al. in U.S. Pat. No. 5,798,019.

The photosensitive element can be manufactured in several ways, and sold in one embodiment as a printing form precursor having all requisite layers, i.e., the photopolymerizable layer, the cell pattern layer, and the digital layer. Alternatively, the photosensitive element can sold as separate components, e.g., a digital coversheet having the digital layer and the cell pattern layer on a support; and, a photopolymerizable element having at least the photopolymerizable layer on the optional support, that are manipulated separately, but are assembled to form a photosensitive element prior to imagewise exposure of the photopolymerizable layer.

1. In one embodiment, a digital composition is coated onto a web of a polymeric film, such as polyester film, to form the digital layer on the film. The cell pattern layer is printed continuously onto a side of the digital layer that is opposite the film, to form a digital coversheet. The features of the cell pattern layer are printed continuously so that the printed microcell pattern does not include seams, breaks, or segmentation of the pattern on the digital layer web. The photopolymerizable composition is extruded to form the photopolymerizable layer between a base support, e.g., polyester film, and the digital coversheet, wherein the side of the digital coversheet having the cell pattern layer is contacted to the photopolymerizable layer opposite the support. Printing form precursors that include the base support, the photopolymerizable layer, the cell pattern layer, the digital layer, and the polymeric film as an optional coversheet can be cut to any finished size for sale to end-users.

2. In one embodiment, a digital composition is coated onto a web of a polymeric film, such as polyester film, to form the digital layer on the film. The cell pattern layer is printed non-continuously onto a side of the digital layer that is opposite the film, to form a digital coversheet. The features of the cell pattern layer are printed non-continuously so that the printed microcell pattern can include seams, breaks, or segmentation of the pattern on the digital layer web. The photopolymerizable composition is extruded to form the photopolymerizable layer between a base support, e.g., polyester film, and the digital coversheet, wherein the side of the digital coversheet having the cell pattern layer is contacted to the photopolymerizable layer opposite the support. Printing form precursors that include the base support, the photopolymerizable layer, the cell pattern layer, the digital layer, and the polymeric film as an optional coversheet can be cut to a finished size according to the seams or breaks in the pattern of the digital coversheet.

3. In one other embodiment, a digital composition is coated onto a web of a polymeric film, such as polyester film, to form the digital layer on the film, which is then cut to specific size/s of sheets. The cell pattern layer is printed onto the sheets on a side of the digital layer that is opposite the film using a sheet fed printing press, to form a digital coversheet. The digital coversheet can be laminated to a photopolymerizable layer to form the printing form precursor.

4. In yet another embodiment, a photopolymerizable composition is formed into a layer by any method, e.g., extrusion and calendering, molding, etc. as described above. A cell pattern layer is printed on a surface of the photopolymerizable layer (after removal of coversheet if present) that is opposite the support. In one embodiment, the digital composition is applied by coating to the surface of the photopolymerizable layer having the printed microcell pattern layer, and optionally a coversheet is applied for protection. This method of construction may have particular utility to provide continuous printing form precursors, i.e., in-the-round or cylindrical photopolymerizable printing blanks or printing sleeves, with a microcell pattern.

5. In another variation of the embodiment described in 4, a digital composition is coated onto a polymeric film, such as polyester film, to form the digital layer on the film; and the digital layer on the film is applied by lamination to the surface of the photopolymerizable layer having the printed microcell pattern layer.

6. In still another embodiment, a polymeric film, such as polyester film, is printed with a microcell pattern to form the cell pattern layer on film. A digital composition is coated to form the digital layer onto the surface of the film having the cell pattern layer, forming a digital coversheet. The digital coversheet (which could be sold separate from the photopolymerizable layer or element) is digitally imaged, e.g., by ablating the digital layer or applying heat to thermally image the digital layer, by a digital imager device, which results in the coversheet having a mask formed of the digital layer and the cell pattern layer. The coversheet having the mask and the cell pattern layer, is applied by lamination to a surface of the photopolymerizable layer that is opposite the support, which forms the photosensitive printing precursor.

7. In another variation of the embodiment described in 6, the digital coversheet is prepared to have the mask and the cell pattern layer, but instead of lamination to a solid photopolymerizable layer, the coversheet is utilized in a liquid flexographic plate making system. In this case, the coversheet having the mask and the cell pattern layer is placed on a support surface in a liquid plate making device, and liquid photopolymerizable composition is applied to form a layer on the coversheet. The liquid photopolymerizable layer is exposed to actinic radiation through the mask and the microcell pattern on the coversheet.

8. In yet another embodiment, a polymeric film, such as polyester film, is printed with a microcell pattern to form the cell pattern layer on the film. A mask of a radiation opaque material is created by ink-jetting onto the cell pattern layer of the film, to create a modified digital coversheet. The modified digital coversheet can be laminated to a surface of the (solid) photopolymerizable layer, or used in the liquid flexographic plate making system as described in 7.

9. In yet another embodiment, a polymeric film, such as polyester film, is printed with a microcell pattern to form the cell pattern layer on the film; and a layer of a thermally imageable composition is applied on the cell pattern layer on the film to create a digital coversheet that is imaged thermally to create a mask. In an alternate embodiment, the microcell pattern is printed with the ink to form the cell pattern layer on a layer of the thermally imageable composition on a film. Either embodiment is laminated to a surface of the photopolymerizable layer to form a photosensitive element.

10. In yet another embodiment, a polymeric film, such as polypropylene film, is printed with a microcell pattern of an ink to form the cell pattern layer on the film. A digital layer of a photopolymerizable printing form precursor is digitally imaged by a digital imager to form a mask disposed above the photopolymerizable layer. The polymeric film with the cell pattern layer is laminated to a surface of the precursor having the mask.

Digital mask formation can be accomplished by imagewise application of the digital material in the form of inkjet inks on the photosensitive element. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier may then be removed from the element prior to imagewise Exposure.

Method of Preparing Printing Form from the Photosensitive Element

The method for preparing the printing form includes providing the photosensitive element of the present invention, exposing the photosensitive element to the actinic radiation, and treating the exposed element to form the printing form. In an embodiment in which the photosensitive element forms a printing form, the method for making the printing form includes the steps of providing the photosensitive element having an integrated printed cell pattern layer; digitally forming a mask adjacent to the photopolymerizable layer; imagewise exposing the photosensitive element to actinic radiation through the mask to create exposed portions and unexposed portions of the photosensitive layer; and treating the exposed element to remove the unexposed portions to form a surface suitable for printing.

In one embodiment, the method of preparing a relief printing form from a printing form precursor includes a) imagewise removing the digital layer with infrared laser radiation to form a mask on the photosensitive element as described above that includes actinic radiation opaque areas and open areas, wherein removing of the digital layer reveals the features of the cell pattern layer; b) exposing the photosensitive element to actinic radiation through the mask forming exposed portions and unexposed portions in the photopolymerizable layer; and, c) treating the element of step b) to remove the unexposed portions of the photopolymerizable layer, thereby forming a relief surface suitable for printing.

Exposing the photosensitive element to actinic radiation through the in-situ mask is an imagewise exposure of the photopolymerizable layer. The cell pattern layer is not changed or removed by infrared laser radiation that is used to imagewise remove, i.e., ablate, the digital layer since the cell pattern layer is composed of an ink that is transparent to, i.e., does not absorb, infrared radiation. Since the features of the cell pattern layer are revealed in the open areas of the digital layer to be present during imagewise exposure and are composed of the ink that is opaque to actinic radiation, the features (after treating) create microcells that can appear as irregularities, dimples, or very tiny reverses, on an uppermost surface, i.e., printing surface, of the raised elements of the relief surface. The microcells provide the printing form with the capability to carry or transfer ink sufficiently for uniform and dense printing of solids.

In yet another embodiment in which the photosensitive element forms a relief printing form, the method for making the printing form comprises the steps of providing the photopolymerizable printing precursor having a cell pattern layer disposed between the digital layer and the photopolymerizable layer as described above; imagewise exposing the digital layer of the precursor to infrared laser radiation to selectively ablate or remove the digital layer and form an in-situ mask having open areas in which one or more features, (typically a plurality of features) of the cell pattern layer are uncovered; imagewise exposing the precursor to actinic radiation through the in-situ mask to create exposed portions (i.e., polymerized portions) and unexposed portions (i.e., unpolymerized portions) of the photopolymerizable layer; and treating the exposed precursor to remove the unexposed portions to form a relief surface suitable for printing.

Figure 2:
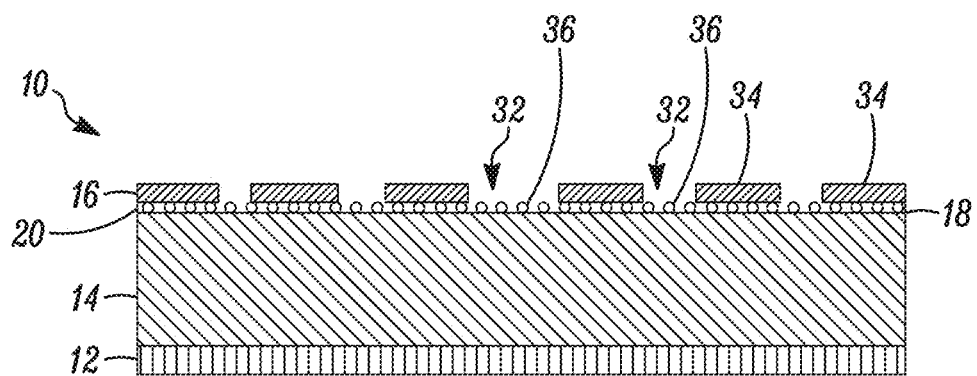
FIG. 2 is a schematic representation of the one embodiment of the photosensitive element shown in FIG. 1, in which an in-situ mask was formed from the digitally imageable layer to include open areas and radiation opaque areas, wherein the layer of the pre-printed microcell pattern is disposed between the digitally imageable layer and the photopolymerizable layer and remains in the open areas of the mask.

FIG. 2 depicts one embodiment of a photosensitive element 10 shown in FIG. 1, after an embodiment of the present method in which the digital layer has been imagewise/selectively removed by ablation with infrared laser radiation to form an in-situ mask having open areas and radiation opaque areas. The cell pattern layer 20 that is disposed between the photosensitive layer 14 and the digital layer 16, is uncovered and revealed in the open areas of the mask.

Digital methods of creating the mask image require one or more steps to prepare the photosensitive element prior to imagewise exposure to actinic radiation. Generally, digital methods of mask formation either selectively remove or transfer the digital layer, from or to a surface of the photosensitive element opposite the support. In most embodiments, the digital layer is sensitive to infrared laser radiation, particularly near-infrared laser radiation. The method by which the mask is formed with the digital layer on the photosensitive element is not limited.

Digital workflow is the formation of the mask digitally with laser radiation, and may also be referred to as a digital exposure or process, and the use of a digitally formed mask may be referred to as digital direct-to plate image process. Some suitable direct-to-plate image formation methods are disclosed in U.S. Pat. Nos. 5,262,275; 5,719,009; 5,607,814; van Zoeren, U.S. Pat. No. 5,506,086; and EP 0 741 330 A1. For the digital workflow, the presence of the digital layer is required. An image-bearing mask is formed directly onto the digital layer using an infrared laser of a digital imager device, such as disclosed in U.S. Pat. Nos. 5,760,880 and 5,654,125. The exposure can be carried out using various types of infrared lasers, which emit in the range 750 to 20,000 nm, preferably in the range 780 to 2,000 nm. Diode lasers may be used, but Nd:YAG lasers emitting at 1060 nm, and Ytterbium fiber lasers emitting at 1090 nm are preferred. Alternative methods of forming the mask digitally, i.e., by transfer of actinic radiation opaque mask, or lamination of a digitally formed mask, as well as formation of the mask by ink-jetting are described above for the photosensitive element.

After mask formation digitally, the photosensitive element is then exposed to actinic radiation through the mask. Imagewise exposure of printing form precursors through such digitally formed mask to actinic radiation can be done in the presence of atmospheric oxygen; in an environment of an inert gas; or in controlled environment having an inert gas and a concentration of oxygen that is less than atmospheric but greater than completely inert gas. In other embodiments, imagewise exposure of the precursor to actinic radiation can be done with or without a coversheet or other protective film that is transparent to actinic radiation, that is placed on or disposed above the mask, with or without lamination, or with or without a vacuum.

On exposure, the transparent areas of the negative or the blank areas of the digital mask allow addition polymerization or crosslinking to take place, while the opaque areas remain uncrosslinked. Imagewise exposing the photopolymerizable element to actinic radiation creates exposed portions that polymerize, and unexposed portions that remain unpolymerized of the photopolymerizable layer. Exposure is of sufficient duration to crosslink the exposed areas down to the support or to the back exposed layer, i.e., floor. Imagewise exposure time is typically much longer than backflash time. Exposure time can vary from a few seconds to tens of minutes, depending on the intensities and wavelengths of the actinic radiation, the nature and volume of the photopolymerizable layer, the desired image resolution, and the distance from the photosensitive element.

The next step in preparing the relief printing form, the photosensitive element of the present invention is exposed to actinic radiation from suitable sources. Actinic radiation sources encompass the ultraviolet and visible wavelength regions. The suitability of a particular actinic radiation source is governed by the photosensitivity of the initiator and the at least one monomer used in preparing the photosensitive element. The preferred photosensitivity of most common relief printing forms is in the UV and deep visible area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115w), and the Philips UV-A "TL"-series low-pressure mercury-vapor fluorescent lamps. These radiation sources generally emit long-wave UV radiation between 310-400 nm. Flexographic printing plates sensitive to these particular UV sources use initiators that absorb between 310-400 nm. It is contemplated that the imagewise exposure to infrared radiation for those embodiments which include the infrared-sensitive layer and the overall exposure to actinic radiation can be carried out in the same equipment. The radiation source can be used at a distance of about 1.5 to about 60 inches (about 3.8 to about 153 cm) from the photosensitive element. Exposure temperatures are preferably ambient or slightly higher, i.e., about 20° C. to about 35° C.

Imagewise exposure of the present photosensitive element can occur in the presence of atmospheric oxygen (conventional digital workflow); in the absence of atmospheric oxygen, such as under an inert gas blanket or a layer of fluid, or with an oxygen barrier film or layer; or, in a controlled environment having an inert gas and a concentration of oxygen that is less than atmospheric but greater than a completely inert gas environment (modified digital workflow). Conventional digital workflow methods imagewise expose the photosensitive element to actinic radiation in air under normal atmospheric conditions, which is 78% nitrogen, ~21% oxygen, <1% each argon and carbon dioxide, and trace amounts of other gases. In other words, the concentration of oxygen is about 210,000 ppm when the imagewise exposure is in air.

In some embodiments, imagewise exposure of the present photosensitive element occurs in a modified digital workflow, which is in a controlled environment of an inert gas and concentration of oxygen. Imagewise exposure of the photosensitive element to actinic radiation is conducted in an environment that includes the presence of an inert gas and an oxygen concentration of between 190,000 to 100 part per million (ppm). The inert gas is a gas that exhibits no or a low reaction rate with the photosensitive element (that is, inert to the polymerization reaction), and is capable of displacing oxygen in the exposure environment (i.e., closed exposure chamber). Suitable inert gases include, but are not limited to, argon, helium, neon, krypton, xenon, nitrogen, carbon dioxide, and combinations thereof. Although the inert gas and combinations or mixtures of inert gases may include a small portion of oxygen, the presence of the small portion of oxygen does not significantly alter the capability of the inert gas to replace the atmospheric air in the chamber or to maintain the desired oxygen concentration in the chamber. In one embodiment, the inert gas is nitrogen.

Imagewise exposure of the photosensitive element in the particular environment of inert gas and oxygen concentration between 190,000 and 100 ppm provides the printing form with a relief structure of a plurality of raised surfaces each having a ink carrying top surface area that is structurally similar to an ink carrying top surface area created in a printing form that was prepared with analog workflow. That is, the top surface area of the raised surfaces in the relief printing form prepared according to the present method is flat or substantially flat, and not rounded as is typical of conventional digital workflow wherein the element is exposed in the presence of atmospheric oxygen. Imagewise exposure in the modified digital workflow also provides for the creation and retention of the microcells on the top surface area, i.e. printing surface of the resulting printing form. In one embodiment, the photosensitive element does not include any additional layers on top of the in-situ mask, which additional layers may act as a barrier to the environment to the surface being imagewise exposed.

Exposure devices that provide a chamber for exposing the photosensitive element in a controlled environment are disclosed. Exposure devices include a closed exposure chamber, a source of actinic radiation, a source of gas for introduction to the closed exposure chamber, and a means for measuring the concentration of oxygen within the closed exposure chamber. The source of actinic radiation is capable of impinging the actinic radiation on a side of the photosensitive element having the in-situ mask while the photosensitive element resides in the closed exposure chamber. The source of actinic radiation can be located adjacent to the photosensitive element. In some embodiments, the source of actinic radiation is located adjacent the closed exposure chamber.

For modified digital workflow, during imagewise exposure of the photosensitive element, the photosensitive element is encased or substantially encased within the closed exposure chamber, such that the closed exposure chamber has an internal environment that is different during exposure from an environment external to the closed exposure chamber. The internal environment in the closed exposure chamber is a particular environment of a gas or gases, i.e., inert gas, and a concentration of oxygen between 190,000 ppm and 100 ppm. The closed exposure chamber encloses the photosensitive element in the internal environment during exposure so as to control or maintain the oxygen concentration in the exposure chamber. The closed exposure chamber can be a separate enclosure appended within or mounted to an existing exposure apparatus, or can be incorporated into the frame of an exposure apparatus, or can be formed from an existing structure integrated in an exposure apparatus, such as a housing. In one embodiment, the closed exposure chamber is an integral part of an exposure apparatus, such that the exposure apparatus can accommodate all workflows, that is, analog workflow process with exposure under vacuum, conventional digital workflow with exposure in air, and modified digital workflow with exposure in the environment of inert gas and oxygen concentration between 190,000 and 100 ppm. The source of actinic radiation can be located within or outside the closed exposure chamber, provided that the source is capable of impinging the actinic radiation onto the side of the photosensitive element having the in-situ mask. The source of actinic radiation is or can be positioned adjacent the closed exposure chamber, and in particular is or can be positioned adjacent the photosensitive element. In particular, the source of actinic radiation should be located, positioned, or positionable such that the source can expose the photosensitive element through the in-situ mask while the element is enclosed in the chamber.

For printing form precursors that will be used as relief printing forms, the method usually includes a back exposure and a front image-wise exposure. The back exposure or "backflash" can take place before, after, or during imagewise exposure. Backflash prior to image-wise exposure is generally preferred. A backflash is an overall or blanket exposure of actinic radiation through the support of the photopolymerizable precursor, for a time that can range from a few seconds to about 30 minutes. The backflash creates a shallow layer of polymerized material, or a floor, on the support side of the photopolymerizable layer and sensitizes the photopolymerizable layers, helps highlight dot resolution and also establishes the depth of the relief surface for the printing form. The floor improves adhesion of the photopolymerizable layer to the support, and provides better mechanical integrity to the photosensitive element. The floor thickness varies with the time of exposure, exposure source, the thickness of the photopolymerizable layer, etc. In some embodiments, the backflash exposure suitable to establish the floor is conducted during manufacture of the precursor, after the precursor is structurally assembled and includes photopolymerizable layer adjacent the support with the at least one indicia. In most other embodiments, a backflash exposure of minimal time and/or energy is conducted during manufacture of the precursor to assure adhesion of the photopolymerizable layer to the support, and another backflash exposure of a time and/or energy is conducted by the user during conversion from precursor to printing form to establish the floor and depth of the relief.

Following overall exposure to UV radiation through the image-bearing mask, the photosensitive printing element is treated to remove unpolymerized areas in the photopolymerizable layer and thereby form a relief image. The treating step is not limited, and includes conventional steps to transform the exposed photosensitive element into the desired printing form. Treating can include treatment with one or more solutions, such as washout or by applying heat, etc. as appropriate for the particular type of photosensitive element that converts the imaged photosensitive layer to a printing form. Treatment of the photosensitive printing element can include (1) "wet" development wherein the photopolymerizable layer is contacted with a suitable developer solution to washout unpolymerized areas and (2) "dry" development wherein the photopolymerizable layer is heated to a development temperature which causes the unpolymerized areas to melt or soften or flow and is contacted with an development medium to blot or wick away the unpolymerized material. Dry development may also be called thermal development.

Wet development is usually carried out at about room temperature. The developer solution can include an organic solvent, an aqueous or a semi-aqueous solution, or water. The choice of the developer solution will depend primarily on the chemical nature of the photopolymerizable composition to be removed. A suitable organic solvent developer includes an aromatic or an aliphatic hydrocarbon, an aliphatic or an aromatic halohydrocarbon solvent, or a mixture of such solvents with a suitable alcohol. A suitable semi-aqueous developer can contain water and a water miscible organic solvent and an alkaline material. A suitable aqueous developer can contain water and an alkaline material. Other suitable aqueous developer solution combinations are described in U.S. Pat. No. 3,796,602. Development time can vary, but it is preferably in the range of about 2 to about 25 minutes. The developer solution can be applied in any convenient manner, including immersion, spraying, and brush or roller application. Brushing aids can be used to remove the unpolymerized portions of the photosensitive printing element. Washout can be carried out in an automatic processing unit which uses developer and mechanical brushing action to remove the unexposed portions of the resulting relief printing form, leaving a relief constituting the exposed image and the floor.

Following treatment by developing in solution, the printing forms are generally blotted or wiped dry, and then more fully dried in a forced air or infrared oven. Drying times and temperatures may vary, however, typically the plate can be dried for about 60 minutes to about 120 minutes at about 60° C. High temperatures are not recommended because the support can shrink, and this can cause registration problems.

In thermal development, the photopolymerizable layer can be heated to a development temperature typically between about 40° C. and 200° C. which causes the unpolymerized areas to liquefy, that is, to melt, soften, or flow. The photopolymerizable layer can then be contacted with a development medium, such as an absorbent material, to remove the unpolymerized photopolymerizable composition. The polymerized areas of the photopolymerizable layer have a higher melting temperature than the unpolymerized areas and therefore do not melt at the development temperatures (see U.S. Pat. No. 5,215,859 and WO 98/13730). Apparatus suitable for thermal development of photosensitive printing elements is disclosed in U.S. Pat. Nos. 5,279,697 and 6,797,454.

The printing forms prepared by the method of the present invention can be uniformly post-exposed to ensure that the photopolymerization process is complete and that the photosensitive printing form will remain stable during printing and storage. This post-exposure step can utilize the same radiation source as the main exposure. Detackification is an optional post-development treatment which can be applied if the surface of the flexographic printing plate is still tacky, such tackiness not generally being removed in post-exposure. Tackiness can be eliminated by methods well known in the art, such as treatment with bromine or chlorine solutions, and by exposure to radiation sources having a wavelength not longer than 300 nm.

After treating, the printing form has a relief surface of raised elements for carrying and transferring ink imagewise to a substrate, and recessed portions that do not print. The features of the printed cell pattern layer create microcells, which are image elements that alter a print surface that can appear as dimples and/or very tiny reverses, and that are each smaller in at least one dimension than the spacing between halftone dots of the highest line screen halftone areas (if areas of halftone dots are being printed) by the relief printing form. The microcells are each smaller in at least one dimension than the spacing between smallest periodic structures on the printing form.

The present method provides the printing form with the raised printing surfaces composed of fine raised surface elements, in which each raised surface element is well-characterized by its three-dimensional relief shape and has a flat or substantially flat top surface area sufficient to accurately reproduce the desired image on the substrate. No longer is the relief structure in a relief printing form fabricated by digital workflow limited by oxygen inhibition effect on the photopolymerizable layer. The present invention provides for the capability to create the relief surface of the raised surface elements on the printing form that essentially is the recreation of the in-situ mask image, particularly in terms of size of openings in mask relative to the size of the raise surface element (e.g., halftone dot). The present invention avoids the cost and production disadvantages associated with analog workflow, and capitalizes on the efficiencies of digital workflow while avoiding the difficulty of establishing a completely inert environment.

Depending upon many factors, but not limited to, the composition of the photopolymerizable layer; the method used to digitally create the mask; the assembly of the photosensitive element that forms the printing form precursor; the workflow used to imagewise expose the photosensitive element to actinic radiation; the features that were printed in the cell pattern layer provide a one-to-one correspondence, or substantially a one-to-one correspondence with the microcells that are formed in the printing surface of the relief printing form.

The photosensitive element of the present invention is particularly useful in forming a relief printing form for flexographic printing on surfaces which are soft and easily deformable, such as packaging materials, e.g., cardboard and plastic films. The photosensitive elements of the present invention are converted to printing forms that can be used in the form of plates, plates-on-sleeves, plates-on-carriers, plate segments-on-carriers, or as seamless, continuous flexographic printing forms.

Those skilled in the art, having benefit of the teachings of the present invention as hereinabove set forth, can effect numerous modifications thereto. These modifications are to be construed as being encompassed within the scope of the present invention as set forth in the appended claims.

EXAMPLES

In the following examples, all percentages are by weight unless otherwise noted. CYREL® photopolymerizable printing plates, CYREL® exposure unit, and CYREL® processor are all available from The DuPont Company (Wilmington, Del.).

Example 1

This example demonstrates the method of creating a digital printing form precursor having a layer of cell pattern that was printed with an ink and integrated between an infrared-sensitive laser ablatable layer and a photopolymerizable layer. More than one design of printed cell patterns are demonstrated as capable of increasing the density of ink in solid areas that are printed by a printing form prepared from the digital precursor having the integrated cell pattern.

Preparation of Printing Plates for Printing Cell Pattern

Several relief printing plates were prepared in order to print a cell pattern with ink onto the layer of the laser ablatable composition of a digital coversheet. A CYREL® 45DPR photopolymerizable printing plate precursor, which included in order a base support, a layer of a photopolymerizable composition, a layer of an infrared laser ablatable composition, and a polyester coversheet, was used to make relief printing plate having a relief surface suitable to print a cell pattern onto a digital coversheet. The 45DPR has a thickness of the photopolymerizable layer and the base support after processing that is about 45 mils.

Five different cell pattern units were designed, tiled, and each stored as an image file in a digital imager unit having an infrared laser radiation suitable for forming a digital mask on the precursor. As shown in FIG. 3a through FIG. 3e, each cell pattern unit includes black blocks which represent areas of the digital layer (of the 45DPR precursor) that will be removed or ablated by infrared laser radiation; and, clear or white blocks which represent areas of the digital layer that will remain on the precursor. Each cell pattern unit has a percent mask transparency value which is obtained by dividing the total number of black blocks by the total number of blocks in the pattern. The mask transparency value is one easy way of distinguishing patterns, but it is not all inclusive. In some instances, cell pattern units can have the same percent mask transparency value, but could produce different results, i.e., solid ink density or graininess. Each cell pattern unit was tiled to provide desired coverage and used by the digital imager unit to form an in-situ mask of the digital layer on the 45DPR precursor.

A relief printing plate was prepared for printing each of the five cell patterns as follows. The coversheet was removed from the 45DPR precursor. The precursor was mounted on a drum of an Esko CDI Advance 5080 digital imager unit (from Esko-Graphics, a Danaher company (Gent, Belgium)), that was equipped with Optics 40, High Resolution Optics and Pixel+ imager at 4000 pixels per inch, and an in-situ mask was formed on the precursor by laser ablating the infrared ablatable layer by repeating one of the particular cell pattern units as described in FIG. 3a through FIG. 3e. The CDI digital imager used laser energy of 3.8 Joules/cm$^2$, and Pixel+ amplitude of 210.

The precursor was placed in a CYREL® 3000 ETL-D exposure unit and exposed to ultraviolet radiation at 365 nm at about 16 milliWatts/cm$^2$ in a chamber having nitrogen gas environment for imagewise exposure through the in-situ mask for a time that was sufficient to imagewise cure the photopolymerizable layer. The nitrogen gas environment eliminated oxygen from the chamber during exposure so that the resulting relief surface of the printing plate would hold the extremely fine details that were necessary to print cell patterns on the laser ablatable layer of a Digital Coversheet. The precursor was overall exposed through the support at the wavelength and energy described above for a time sufficient to form a floor of photopolymer for the relief plate. The exposed precursor was treated in a CYREL® processor using CYLOSOL washout solvent, dried, post-exposed, and light finished in accordance with the conditions recommended for 45DPR plate precursors to form a printing plate having a relief surface suitable for flexographic relief printing. The printing plate was cut to 7×11.5 in. size for printing.

Printing Cell Pattern on Digital Coversheet

For each Test Digital Coversheet, one of the printing plates made above (from 45DPR precursor) was mounted using 3M 1020™ tape on a plate cylinder of a Mark Andy 830™ press. The plate cylinder had a 0.130 inch cutback and a 96 tooth gear to give a 12 inch repeat pattern. Printing was done with an anilox roll having 2000 LPI, with volume of 0.7 BCM. The printing was done at 180 feet per minute.

The press was loaded with Sun Chemical TXLFW5834901 Aquaverse Process Cyan ink. The ink is opaque to actinic radiation, specifically ultraviolet (uv) radiation, but is transparent to the wavelength of laser radiation used in the digital imager, i.e., infrared (IR) radiation. Earlier, the ink was evaluated for its ability to be opaque to ultraviolet radiation and transparent to infrared radiation, by printing the ink as a solid area with the same or substantially the same print density as will be used to print the cell pattern layer on a clear (i.e., transparent) polyester film, and measuring the printed area of ink for UV radiation absorbance, and testing the IR radiation transmittance on the digital imager. The UV radiation absorbance of the ink was about 1.5 units, which means that less than about 4% of the UV radiation passed through the printed solid area of ink, and thus is sufficiently opaque to UV radiation. The area of the printed ink on the film was placed on the drum of the digital imager and then exposed to the IR laser radiation. The solid ink area was shown not effected, i.e., not altered, changed, or ablated, by the IR radiation from the digital imager. This meant that the ink sample does not absorb at the wavelength of light that was used in the digital imager (1064 nanometers).

Separately, an infrared sensitive ablatable composition was prepared and coated as a layer onto a web of a MYLAR® polyester film substantially as described in Example 1 of U.S. Pat. No. 6,238,837. When dried, the infrared sensitive ablatable layer included about 67 wt % of a polyamide (Macromelt® 6900) and about 33 wt % of carbon black. The infrared sensitive layer on the web of polyester film is referred to as an infrared sensitive element. The polyester film functions as a support for the laser ablatable layer, but will function as a protective coversheet when joined with the Laminated Plate as described below.

The infrared sensitive element web was mounted on the press so that the ink was printed by the printing plate as a cell pattern on a surface of the infrared ablatable layer that is opposite the polyester film support. The web, which now included the particular micro pattern printed in ink, was cut to size to form Test Digital Coversheet.

Reproduced microscopic images of each of the five different cell patterns after printing on a laser ablatable layer are shown in FIG. 4a through FIG. 4e. Clearly, the small size of these features approaches the limit as to what can be printed using flexography, especially with the particular press that was used. The printed patterns shown in FIG. 4a, FIG. 4b, and FIG. 4c were all faithfully reproduced on the laser imaging layer. The printed pattern shown in FIG. 4d and FIG. 4e was not well reproduced since the ink tended to run together resulting in the patterns shown.

Preparation of Lamination Plates

Several CYREL® photopolymerizable printing plates, type DSR (67 mil) were modified for use as Printing Plate Precursors for this example. Type DSR photopolymerizable printing plates include in order, a base support, a layer of a photopolymerizable composition, an infrared laser-ablatable layer, and a coversheet. The photopolymerizable layer included an elastomeric binder of an ABA block copolymer, monomer/s, photoinitiator, and other additives. The 67DSR has a thickness of the photopolymerizable layer and the base support after processing that is about 67 mils.

The Printing Plate Precursors were prepared from DSR printing plates except that the coversheet and the laser ablatable layer were replaced with a sheet of 601 MYLAR® polyester (PET) film (from DuPontTeijin Films, Chester, Va., USA), which is a clear sheet of PET film having surface with a siliconized coating. This is resulted in a construction structure consisting of in order the base support, the photopolymerizable layer, and the siliconized PET film, that will be referred to as a Lamination Plate throughout the remainder of the Example. The Lamination Plate is useful, because the siliconized PET film can be easily removed without affecting the photopolymerizable and base support layers; and, other coversheets (having the laser ablatable layer and a particular cell pattern layer) can then be easily laminated to the photopolymerizable layer in order to test printing plate precursors having different coversheets with the same type of photopolymerizable composition.

Preparation of Test Printing Plate Precursors

A Lamination Plate, size 8×25 inch, was placed on a 20×30 inch sheet of stainless steel (2 mils thick). The siliconized PET film was removed from the Lamination Plate, uncovering the photopolymerizable layer of the Lamination Plate. A Cromalin™ Laminator was heated to 100° C. A Test Digital Coversheet (prepared as described above), which was at least 1 inch larger than the Lamination Plate in all directions, was held so that its leading edge contacted a leading edge of the Lamination Plate; and, was oriented so that the layer of the printed cell pattern would be disposed between the infrared-sensitive ablation layer of the Test Coversheet and the photopolymerizable layer of the Lamination Plate. The assembly of the Lamination Plate with the Test Coversheet was then fed, leading edge first, through the heated laminator with minimal pressure. The resultant printing plate precursor was then placed in a drying oven at 60° C. overnight to insure adequate bonding of the laser ablatable layer of the Test Coversheet to the photopolymerizable layer. Portions of the Test Coversheet that were excess, i.e., overhung the photopolymerizable layer, were then trimmed and removed, and the Printing Plate precursor was ready for imaging. For each Test Coversheet that was prepared as described above, a Test Printing Plate Precursor was prepared from a Lamination Plate and each Test Coversheet by the lamination process described. Each of the Test Coversheets having the infrared-sensitive ablation layer on a support, and a particular cell pattern printed with an ink that is UV-opaque and IR-transparent on the infrared-sensitive ablation layer was laminated to a Lamination Plate using the method described above. The final structure of the Test Printing Plate Precursor was, in order, a polyester film support, a photopolymerizable layer, a layer of printed cell pattern, an infrared-sensitive laser ablatable layer used to form mask, and a removable polyester film support as a protective coversheet.

In addition to preparing the Test Printing Plate Precursors by laminating each Test Coversheet to a Lamination Plate, a Control Printing Plate Precursor was also prepared by laminating a conventional coversheet having the infrared laser ablatable layer that did not include a printed cell pattern.

The Test Printing Plate Precursors were formed of the Laminated Plate and the Digital Coversheet as described above, and allowed to age for about 1 week at ambient conditions.

Conversion of Test Printing Plate Precursors to Relief Printing Plates

For each Test Printing Plate Precursor, the coversheet (which was the support for the infrared ablation layer) was removed, the Test Printing Plate Precursor was mounted on the drum of the digital imager unit as described above, and then an in-situ mask was formed on the Test Printing Plate Precursor by selectively exposing with infrared laser radiation to ablate, i.e., remove, the infrared-sensitive ablation layer. The in-situ mask was a simple solid pattern, in which the infrared-sensitive ablation layer was removed, i.e., ablated, from the entire plate surface. Although the infrared laser radiation removed the infrared ablatable layer from the Test Printing Plate Precursor, the printed cell pattern that was disposed between infrared ablation layer and the photopolymerizable layer was not affected. The Plate Precursor was placed in a CYREL® 3000 ETL-D exposure unit and exposed to ultraviolet radiation at 365 nm at about 16 milliWatts/cm$^2$ in a chamber having an environment of nitrogen gas and controlled concentration of oxygen of about 3% for imagewise exposure through the in-situ mask for a time that was sufficient to imagewise cure the photopolymerizable layer. Exposure in the controlled environment of nitrogen gas and oxygen concentration of 3% was sufficient to form desired shape of the raised elements, such as flat-topped highlight dots, and form the microcell pattern on the print surface of the relief printing plate without the extra time and control required to assure complete inert gas environment of nitrogen. Similar to the preparation of the 45DPR printing plates to print the cell pattern, the Plate Precursor was then exposed to ultraviolet radiation through the support, washout developed in solvent solution, dried, post-exposed and light finished as described above, but in accordance with the standard practices for a DSR plate, to produce Test Relief Printing Plate having a relief surface.

Figure 5A:
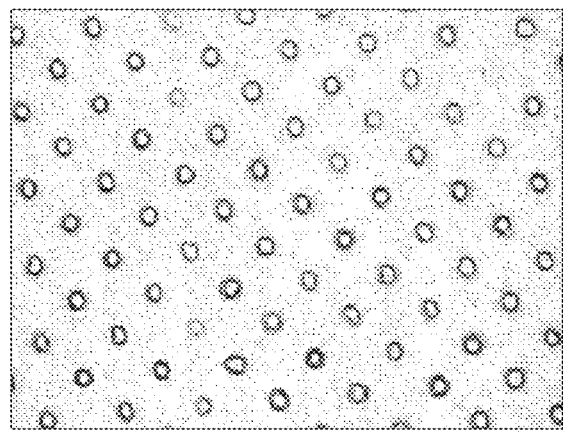
FIG. 5a through 5e are reproductions of a microscope image of a printing surface of each Test Relief Printing Plate that were prepared from Test Printing Plate Precursor of Tests 1 through 5, respectively, as described in Example 1. All microscope images were taken with a Zeiss Axio Observer Z1M microscope, in reflectance mode.
Figure 5B:
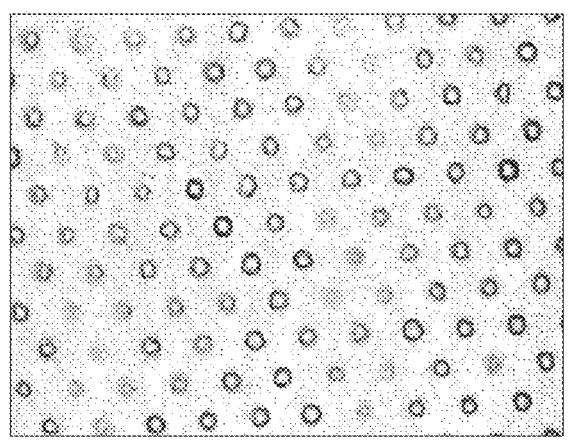
Figure 5C:
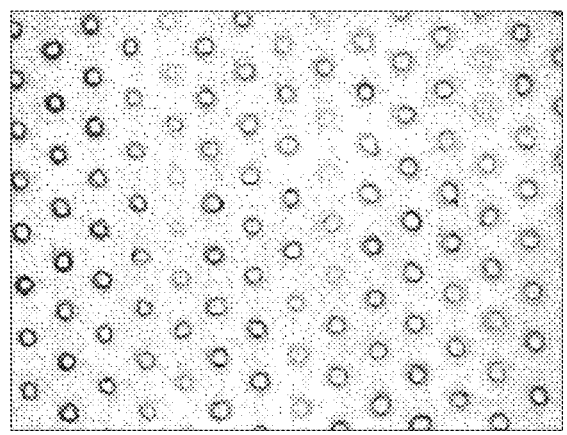

A reproduction of the microscope image of the printing surface, i.e., uppermost ink-carrying surface of the "solid" raised portion of the relief surface, of each of the resulting Test Relief Printing Plates is shown in FIG. 5a through 5e. For each of the five cell patterns printed for the Digital Coversheet, a microcell pattern was formed into the uppermost ink-carrying surface of the Test Relief Printing Plate. As shown in FIG. 5a, FIG. 5b, and FIG. 5c, each cell pattern (generated by the cell pattern units represented in FIG. 3a, FIG. 3b, and FIG. 3c respectively) was faithfully reproduced overall on the ink-carrying surface of the solid raised portion forming repeating microcell structures (i.e., recesses in the ink-carrying surface) that are well-formed or substantially well-formed, wherein each cell of the microcell patterns is between 5 and 10 microns. For FIG. 5d and FIG. 5e, each cell pattern (generated by cell pattern units represented in FIG. 3d and FIG. 3e, respectively) the microcell structures that were reproduced overall on the ink-carrying surface of the solid raised portion have substantially larger structures (i.e., greater than 15 microns) since the cell patterns were not faithfully reproduced during printing.

Each of the Test Relief Printing Plates was used to print the solids onto a substrate. Each Test Relief Printing Plate was mounted onto a PCMC Avanti Central Impression flexographic printing press, and Sun Process GS Cyan CRVFS5134539/K525 solvent-based printing ink was used to print onto a Bemis 20" wide, 1.5 mil Film (White LLDPE Mono (MA11-A104-E0) as the substrate.

The ink density of the solid printed areas was measured using a Techkon SpectroJet scanning spectrophotometer-densitometer (from Techkon USA (Danvers, Mass., U.S.A)). The solid ink density values on the substrate that were created by the Test Relief Printing Plates are reported below.

Figure 3G:
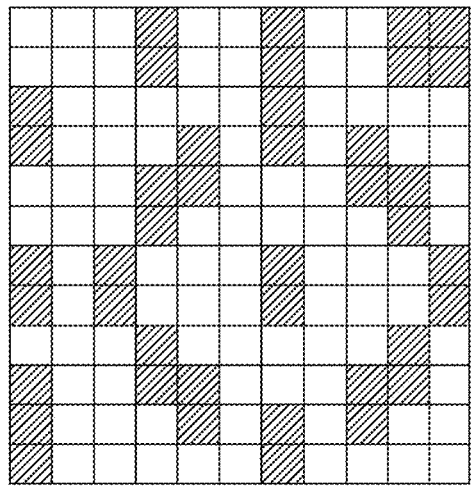
Figure 4A:
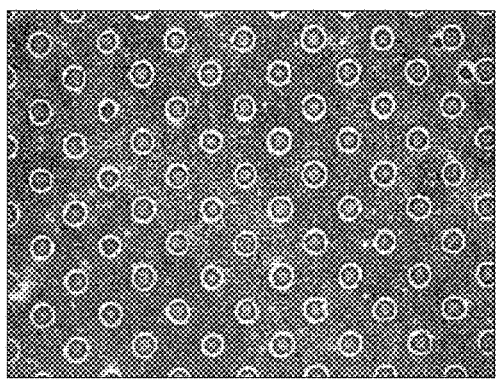
FIG. 4a through FIG. 4e are reproductions of microscopic images taken of each Digital Coversheet for Test 1 through Test 5, respectively, after printing as described in Example 1, showing a particular printed cell pattern of ink on top the infrared sensitive ablatable layer of the infrared sensitive element, to form a Test Digital Coversheet. All microscope images were taken with a Zeiss Axio Observer Z1M microscope, in reflectance mode.
Figure 4B:
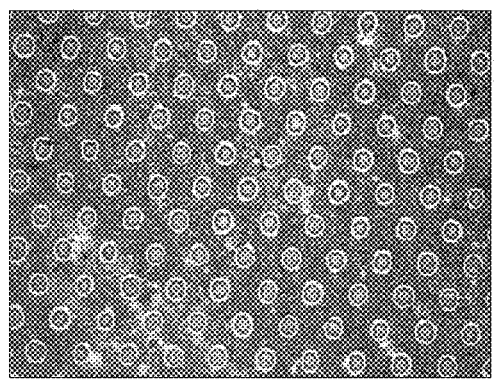
Figure 4C:
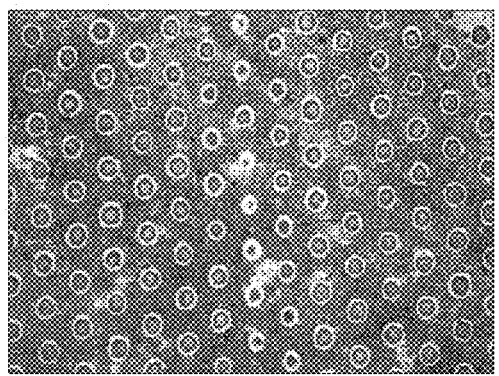
Figure 4D:
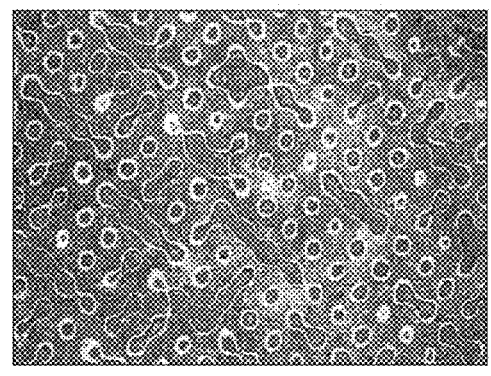
Figure 4E:
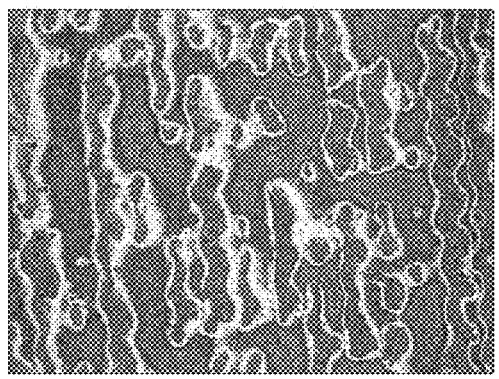
Figure 5D:
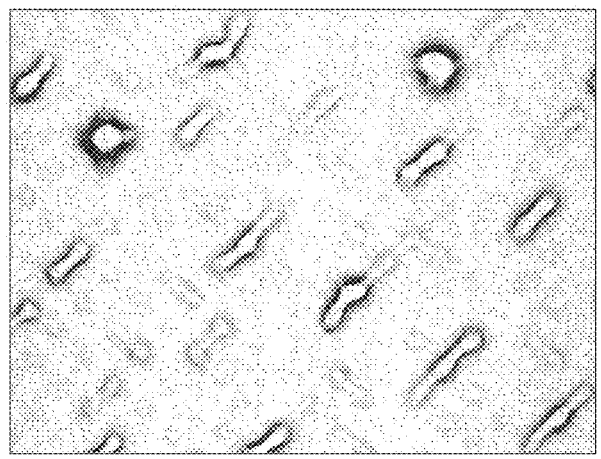
Figure 5E:
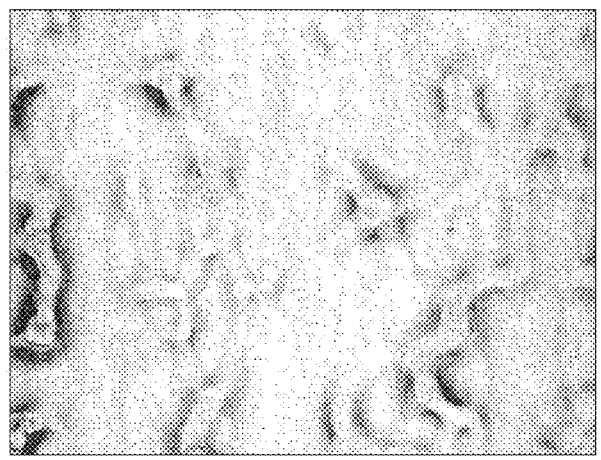

| EXAMPLE 1 Test Relief Printing Plate | Cell Pattern Unit Shown in | Cell Pattern Printed on Digital Coversheet Shown in | Microcell Pattern Formed on Solid Area Shown in | Solid Ink Density |
|---|---|---|---|---|
| Test Plate 1 | FIG. 3a | FIG. 4a | FIG. 5a | 1.34 |
| Test Plate 2 | FIG. 3b | FIG. 4b | FIG. 5b | 1.41 |
| Test Plate 3 | FIG. 3c | FIG. 4c | FIG. 5c | 1.45 |
| Test Plate 4 | FIG. 3d | FIG. 4d | FIG. 5d | 1.3 |
| Test Plate 5 | FIG. 3e | FIG. 4e | FIG. 5e | 1.28 |
| Control | none | none | None | 1.27 |

As shown in the results, Test Plate 1, Test Plate 2, and Test Plate 3 gave a visually significant increase in solid ink density over the Control that was made without a cell pattern printed image on the laser ablation layer. Test Plate 4 and Test Plate 5 did not give a visually noticeable increase in solid ink density compared to the Control. This is because the cell pattern units (of FIG. 3d and FIG. 3e) that were designed for printing on the laser ablation layer were not faithfully reproduced during the printing process as shown in the images of the Digital Coversheets of FIG. 4d and FIG. 4e, respectively. The cell pattern units of FIG. 3d and FIG. 3e may have been faithfully reproduced by printing with the specific ink on the infrared-sensitive laser ablation layer of the Digital Coversheet and thus effective at creating suitable microcell pattern on the relief printing plate, if the printing of the cell pattern on the Digital Coversheets was done on a better press with improved resolution as compared to the Mark Andy 830 that used during this test, and could faithfully print the desired cell patterns.

In general, if the percent mask transparency value is too low, little improvement in solid ink density is observed; and if the value is too high, it can be difficult to print the cell pattern since the ink tends to flow together and can becomes a solid (instead of printing individual elements of the pattern).

Example 1 (Test Plate 1 through Test Plate 5) demonstrated that significant increases in solid ink density can be accomplished by a relief printing form that incorporates a microcell pattern as an integral layer of a printing form precursor having a digitally imageable layer, i.e., an infrared-sensitive laser ablatable layer. Example 1 also demonstrated that a cell pattern, which is useful in forming microcell pattern on a relief printing form, can be incorporated into a printing form precursor by printing a cell pattern image with a particular ink onto a surface of a laser ablatable layer, which is then joined with a photopolymerizable layer to create the digital precursor. Best results are achieved with the cells of the printed cell pattern that have a size that is less than 20 microns, and more preferably less than 10 microns.

The printed image of cell pattern that is included with the digital coversheet should be transparent to the wavelength of the laser radiation, i.e., near infrared radiation, used to ablate the laser ablatable layer from the precursor and form the in-situ mask, so that the cell pattern is not also removed during ablation; and also should be opaque or sufficiently opaque to actinic radiation, e.g., ultraviolet radiation, so that the printed cell pattern can produce microcell structures on the printing surface of the printing form that will result in printing with increased solid ink density.

Example 2

This example demonstrates the method of creating a digital printing form precursor having a layer of a cell pattern, which was printed with an ink and integrated between an infrared-sensitive laser ablatable layer and a photopolymerizable layer of the precursor. Additional designs of printed cell patterns are demonstrated as capable of increasing the density of ink in solid areas that are printed by a printing form prepared from the digital precursor having the integrated cell pattern.

Example 1 was repeated as described above with the following differences.

A new cell pattern unit was designed as shown in FIG. 3f, and used by the digital imager unit to form an in-situ mask for the 45DPR precursor, which was prepared into a printing plate and used to print the cell pattern onto a surface of an infrared-sensitive laser ablatable layer and form a Digital Coversheet for Test 5 Printing Plate.

Figure 4F:
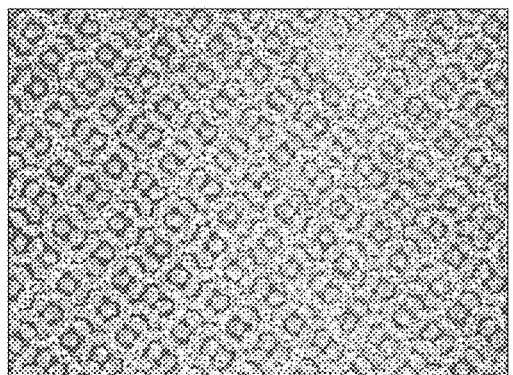
FIG. 4f is a microscopic image taken of the Digital Coversheet for Test 6 of Example 2, after relief printing as described in Example 2, showing a particular combination of printed cell patterns of ink on top the infrared sensitive ablatable layer of the infrared sensitive element, to form Test 6 Digital Coversheet. The particular combination of two different cell patterns (i.e., the repeating cell pattern unit shown in FIG. 3b and the repeating cell pattern unit shown in FIG. 3c) of ink were sequentially printed on top an infrared sensitive ablatable layer of the infrared sensitive element, to form the Test 6 Digital Coversheet of Example 2.

Additionally, a new cell pattern was created on the infrared-sensitive laser ablatable layer by sequential printing of two different repeating cell pattern units, instead of the steps as described in Example 1 of designing and storing as an image file in a digital imager unit a cell pattern unit as shown in FIG. 3g that would be used in forming a digital mask on the precursor. Theoretically, the sequential printing of two different repeating cell pattern units should have created or substantially created as the cell pattern unit that is shown in FIG. 3g. The Digital Coversheet of Test 6 was printed on an infrared-sensitive laser ablatable layer was the combination of the repeating cell pattern unit as shown in FIG. 3b and the repeating cell pattern unit as shown in FIG. 3c. This Digital Coversheet of Test 6 was prepared by first printing with ink by the printing plate that was made with the repetition of cell pattern unit of FIG. 3b onto the laser ablatable layer of the infrared-sensitive element web; and, then printing with ink by the printing plate that was made with the repetition of cell pattern unit of FIG. 3c onto the previously printed cell pattern layer. However, mis-registration of the two different cell patterns and web stretch resulted in a semi-random pattern as shown in the reproduction of the microscopic image taken of the Digital Coversheet as shown in FIG. 4f. Semi-random patterns can have a distinct advantage in avoiding the occasional moiré effects that may be observed when one pattern overlays another.

Digital Coversheets that represent Test cell pattern units of FIG. 3a through FIG. 3d were repeated. However in this example, the printing of the cell pattern on the laser ablation layer of the digital coversheet was done using a PCMC Avanti Central Impression flexographic printing press instead of the Mark Andy press. The ink and the web of the infrared-sensitive laser ablatable layer were the same as described above to form each Digital Coversheet with particular cell pattern layer. However, printing was done with an anilox roll having 2000 cells per inch with a volume of 0.9 BCM and a cell angle of 60 degrees, which was different from the anilox roll used to print the cell pattern on digital coversheet in Example 1.

The Test Printing Plate Precursors were formed of the Laminated Plate and the Digital Coversheet as described above, and allowed to age for two weeks at ambient conditions. A Control plate was prepared having the same photopolymerizable layer and an infrared-sensitive laser ablative layer on the photopolymerizable layer, but without any printed cell pattern layer (and without any microcell pattern created in the infrared-sensitive laser ablative layer by the digital imager).

The Test Printing Plate Precursors prepared for Example 2 were converted to Relief Printing Plates as described above, by forming in-situ mask, and exposing on the exposure unit except that imagewise exposure of the Precursors occurred in the exposure chamber with a controlled environment of nitrogen as an inert gas and an concentration of oxygen of 3%.

Each Test Relief Printing Form was printed as described above, and the resulting density of ink in solid areas on the printed substrate was measured and reported below.

| EXAMPLE 2 Test Relief Printing Plate | Cell Pattern Unit Shown in | Cell Pattern Printed on Digital Coversheet Shown in | Microcell Pattern Formed on Solid Area? | Solid Ink Density |
| --- | --- | --- | --- | --- |
| Test Plate 1 | FIG. 3a | — | Yes | 1.34 |
| Test Plate 2 | FIG. 3b | — | Yes | 1.28 |
| Test Plate 3 | FIG. 3c | — | Yes | 1.28 |
| Test Plate 4 | FIG. 3d | — | Yes | 1.29 |
| Test Plate 5 | FIG. 3f | — | Yes | 1.30 |
| Test Plate 6 | FIGS. 3b & 3c | FIG. 4f | Yes | 1.32 |
| Control | none | none | None | 1.19 |

All of the Test Plates of Example 2 that included a printed cell pattern layer provided significant increase in density of ink in solid printed areas compared to the Control plate having no microcell pattern.

Example 2 demonstrated that significant increases in solid ink density can be made by printing with a particular ink an image on a laser ablatable layer, which is then incorporated into the digital printing form precursor, and utilized in the method to prepare a relief printing form for flexographic printing from the precursor. The printed image should be transparent to near infrared radiation that is used by the digital imager in the ablation process that forms the in-situ mask so as not to be removed by ablation; and, should be sufficiently opaque to ultraviolet radiation in order to produce the fine microcell structures on the printing surface of the relief printing form that result in increased solid ink density upon printing.

Example 3

This example demonstrates the method of creating a digital printing form precursor having a layer of cell pattern, which was printed with an ink and integrated between an infrared-sensitive laser ablatable layer and a photopolymerizable layer of the precursor. Additional designs of printed cell patterns are demonstrated as capable of increasing the density of ink in solid areas that are printed by a printing form prepared from the digital precursor having the integrated cell pattern.

Example 1 was repeated as described above with the following differences.

Figure 3H:
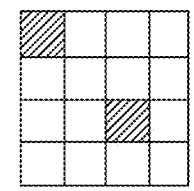

A new cell pattern unit was designed as shown in FIG. 3h, and used by the digital imager unit to form an in-situ mask for the 45DPR precursor, which was prepared into a printing plate and used to print the cell pattern onto a surface of an infrared-sensitive laser ablatable layer and form a Digital Coversheet of Test 1 for Example 3. The CDI digital imager used laser energy of 3.2 Joules/cm$^2$, and Pixel+ amplitude of 120.

Figure 3I:
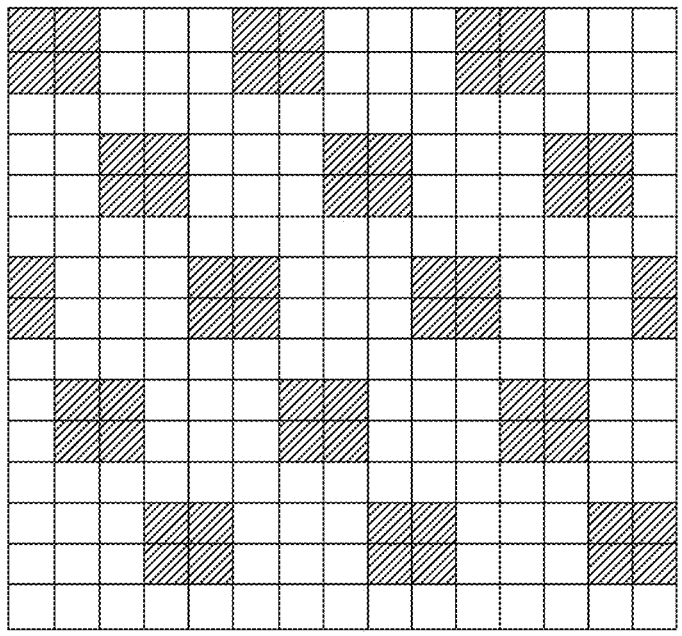

A new cell pattern unit was designed as shown in FIG. 3i, and used by the digital imager unit to form an in-situ mask for the 45DPR precursor, which was prepared into a printing plate and used to print the cell pattern onto a surface of an infrared-sensitive laser ablatable layer and form a Digital Coversheet of Test 2 for Example 3. The CDI digital imager used laser energy of 3.2 Joules/cm$^2$, and Pixel+ amplitude of 120.

Figure 3J:

A new cell pattern unit was designed as shown in FIG. 3j, and used by the digital imager unit to form an in-situ mask for the 45DPR precursor, which was prepared into a printing plate and used to print the cell pattern onto a surface of an infrared-sensitive laser ablatable layer. The CDI digital imager used laser energy of 3.0 Joules/cm$^2$, and Pixel+ amplitude of 120.

The printing plate used to print the repeating cell pattern of FIG. 3j was removed from the drum of the printing press and remounted so that the cell pattern on the printing plate was rotated 90 degrees. The laser ablatable layer with the first printed repeating cell pattern of FIG. 3j was printed a second time (on top of the first printed pattern) with the repeating cell pattern of FIG. 3j rotated to form a Digital Coversheet of Test 3 for Example 3.

The Test Printing Plate Precursors were formed of the Laminated Plate and the Digital Coversheet as described above, and allowed to age for two weeks at ambient conditions. A Control plate was prepared having the same photopolymerizable layer and an infrared-sensitive laser ablative layer on the photopolymerizable layer, but without any printed cell pattern layer (and without any microcell pattern created in the infrared-sensitive laser ablative layer by the digital imager).

Each Test Relief Printing Form was printed as described above, and the resulting density of ink and cyan percent graininess in solid areas on the printed substrate were measured using a Personal Image Analysis System having a digital camera loupe, model PIAS®-II unit (from Quality Engineering Associates, Inc., (Billerica, Mass., USA)), using low resolution optics, and reported below. The higher the value of solid ink density is better for print quality. The lower the value for graininess is better for print quality. Graininess is a measure of the uniformity of the ink laid down on the substrate.

| EXAMPLE 3 Test Relief Printing Plate | Cell Pattern Unit Represented | Microcell Pattern Formed in Solid Area? | Graininess | Solid Ink Density |
|---|---|---|---|---|
| Test Plate 1 | FIG. 3h | Yes | 1.17 | 1.39 |
| Test Plate 2 | FIG. 3i | Yes | 1.13 | 1.39 |
| Test Plate 3 | FIG. 3j (printed twice, with cell pattern rotated) | Yes | 0.40 | 1.40 |
| Control | none | none | 2.28 | 1.32 |

All of the Test Plates of Example 3 that included a printed cell pattern layer provided significant increase in density of ink in solid printed areas compared to the Control plate having no microcell pattern; and, provided a significant reduction in graininess of the solid printed areas compared to the Control plate having no microcell pattern.

Example 3 demonstrated that significant increases in solid ink density and significant reduction in graininess of solid printing can be made by printing with a particular ink an image on a laser ablatable layer, which is then incorporated into the digital printing form precursor, and utilized in the method to prepare a relief printing form for flexographic printing from the precursor. The printed image should be transparent to near infrared radiation that is used by the digital imager in the ablation process that forms the in-situ mask so as not to be removed by ablation; and, should be sufficiently opaque to ultraviolet radiation in order to produce the fine microcell structures on the printing surface of the relief printing form that result in increased solid ink density upon printing.

Example 4

Example 4 is designed to demonstrate the concept of printing a microcell pattern directly onto a plate surface.

A DSR plate was made with 601 MYLAR® polyester as described in the "Preparation of Lamination Plates" section. This time, the coversheet was removed and the raw plate was wrapped around a 3 inch plastic core. As described in the "Preparation of Printing Plates for Printing Cell Pattern" section a relief plate with the image in FIG. 3C was mounted to a Mark Andy 830 press loaded with Sun Chemical TXLFW5834901 Aquaverse Process Cyan ink. The concentric adjustments screws of the press were adjusted so that the plate cylinder contacted the anilox roll, but not the substrate. While the press was running, the raw plate on the 3 inch plastic core was lowered onto the relief plate in such a way that about half of the plate was printed with the microcell pattern. The raw plate was then laminated with a LAMS coversheet as described in the "Preparation of Test Printing Plate Precursors" section. The finished relief plate was then created as described in the section "Conversion of Test Printing Plate Precursors to Relief Printing Plates". The finished plate was then printed on a Mark Andy 830 press using Sun Chemical TXLFW5834901 Aquaverse Process Cyan ink on biaxially oriented polypropylene film. Print measurements were then taken using a PIAS-II™ image quality analysis unit from Quality Engineering Associates. The results for the area with and without the preprinted microcell pattern are shown below. These results shown that the preprinted microcell pattern improved both the print density and the graininess of the final print.

| Area | Cyan Density Mean | Cyan Density Graininess |
|---|---|---|
| Without the Preprinted microcell pattern | 1.45 | 1.1 |
| With the Preprinted microcell pattern | 1.58 | 0.8 |

We claim:

1. A printing form precursor comprising:
  a photopolymerizable layer comprising a first binder, a monomer, and a photoinitiator;
  an infrared ablation layer that is ablatable by infrared radiation and opaque to non-infrared actinic radiation, the infrared ablation layer comprising:
    (i) at least one infrared absorbing material;
    (ii) a radiation opaque material, wherein (i) and (ii) can be the same or different; and
    (iii) at least one second binder;
  a coversheet; and
  a pattern layer that is disposed between the infrared ablation layer and the coversheet, and comprises a plurality of features in which each feature has an area between 5 to 750 square microns and is composed of an ink that is opaque to actinic radiation and transparent to infrared radiation; wherein the infrared ablation layer is for forming an in-situ mask by infrared ablation during the conversion of the printing form precursor to a printing form.

2. The printing form precursor of claim 1 wherein the pattern layer is printed onto a surface of the coversheet, and the infrared ablation layer is formed by coating over the printed pattern layer to form an assembly.

3. The printing form precursor of claim 2 wherein the assembly is ablated by exposure to infrared radiation, and is applied by lamination to a surface of the photopolymerizable layer that is opposite a support.

* * * * *